(12) United States Patent
Saito

(10) Patent No.: US 8,541,846 B2
(45) Date of Patent: Sep. 24, 2013

(54) SEMICONDUCTOR DEVICE

(75) Inventor: Toshihiko Saito, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 264 days.

(21) Appl. No.: 13/026,525

(22) Filed: Feb. 14, 2011

(65) Prior Publication Data
US 2011/0204365 A1 Aug. 25, 2011

(30) Foreign Application Priority Data

Feb. 19, 2010 (JP) ................................ 2010-035435

(51) Int. Cl.
*H01L 29/786* (2006.01)
(52) U.S. Cl.
USPC .................................. 257/365; 257/E29.275
(58) Field of Classification Search
None
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,127,702 A | 10/2000 | Yamazaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,200,050 B2 | 4/2007 | Kato | |
| 7,211,825 B2 | 5/2007 | Shih et al | |
| 7,282,782 B2 | 10/2007 | Hoffman et al. | |
| 7,297,977 B2 | 11/2007 | Hoffman et al. | |

(Continued)

FOREIGN PATENT DOCUMENTS

| EP | 1737044 A | 12/2006 |
|---|---|---|
| EP | 2226847 A | 9/2010 |

(Continued)

OTHER PUBLICATIONS

Ishii.T et al., "A Poly-Silicon TFT With a Sub-5-nm Thick Channel for Low-Power Gain Cell Memory in Mobile Applications,", IEEE Transactions on Electron Devices, Nov. 1, 2004, vol. 51, No. 11, pp. 1805-1810.

(Continued)

*Primary Examiner* — Wensing Kuo
(74) *Attorney, Agent, or Firm* — Eric J. Robinson; Robinson Intellectual Property Law Office, P.C.

(57) ABSTRACT

At least one of a plurality of transistors which are highly integrated in an element is provided with a back gate without increasing the number of manufacturing steps. In an element including a plurality of transistors which are longitudinally stacked, at least a transistor in an upper portion includes a metal oxide having semiconductor characteristics, a same layer as a gate electrode of a transistor in a lower portion is provided to overlap with a channel formation region of the transistor in an upper portion, and part of the same layer as the gate electrode functions as a back gate of the transistor in an upper portion. The transistor in a lower portion which is covered with an insulating layer is subjected to planarization treatment, whereby the gate electrode is exposed and connected to a layer functioning as source and drain electrodes of the transistor in an upper portion.

24 Claims, 15 Drawing Sheets

(56) References Cited

U.S. PATENT DOCUMENTS

| | | |
|---|---|---|
| 7,323,356 B2 | 1/2008 | Hosono et al. |
| 7,385,224 B2 | 6/2008 | Ishii et al. |
| 7,402,506 B2 | 7/2008 | Levy et al. |
| 7,403,435 B2 | 7/2008 | Kato |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0240305 A1 | 12/2004 | Kato |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0147165 A1 | 6/2007 | Kato |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0148171 A1 | 6/2010 | Hayashi et al. |
| 2011/0031499 A1* | 2/2011 | Kimura et al. .................. 257/59 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 02-003149 A | 1/1990 |
| JP | 02-097063 A | 4/1990 |
| JP | 05-251705 A | 9/1993 |
| JP | 08-264794 A | 10/1996 |
| JP | 10-084047 A | 3/1998 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2002-368226 | 12/2002 |
| JP | 2002-368226 A | 12/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-011492 A | 1/2005 |
| JP | 2007-096055 A | 4/2007 |
| JP | 2007-123861 A | 5/2007 |
| WO | WO-2004/114391 | 12/2004 |

OTHER PUBLICATIONS

Kim.W et al., "An Experimental High-Density DRAM Cell with a Built-in Gain Stage,", IEEE Journal of Solid-State Circuits, Aug. 1, 1994, vol. 29, No. 8, pp. 978-981.

Shukuri.S et al., "A Complementary Gain Cell Technology for sub-1 V Supply DRAMs ,", IEDM 92: Technical Digest of International Electron Devices Meeting, Dec. 13, 1992, pp. 1006-1008.

Shukuri.S et al., "A Semi-Static Complementary Gain Cell Technology for Sub-1 V Supply DRAM's,", IEEE Transactions on Electron Devices, Jun. 1, 1994, vol. 41, No. 6, pp. 926-931.

Specification, Claims, Abstract, Drawings of U.S. Appl. No. 12/976,340 to Shionoiri et al. filed Dec. 22, 2010.

Specification, Claims, Abstract, Drawings of U.S. Appl. No. 12/962,041 to Kato et al. filed Dec. 7, 2010.

Specification, Claims, Abstract, Drawings of U.S. Appl. No. 12/966,611 to Yamazaki et al. filed Dec. 13, 2010.

Na.J et al., "High field-effect mobility amorphous InGaZnO transistors with aluminum electrodes,", Appl. Phys. Lett. (Applied Physics Letters), 2008, vol. 93, No. 6, pp. 063501-1-063501-3.

International Search Report (Application No. PCT/JP2011/051836) Dated Apr. 19, 2011.

Written Opinion (Application No. PCT/JP2011/051836) Dated Apr. 19, 2011.

Fortunato.E et al., "Wide-Bandgap High-Mobility ZnO Thin-Film Transistors Produced at Room Temperature,", Appl. Phys. Lett, (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T at al., "Full-Functional System Liquid Crystal Display Using CG-Silicon Technology,", SID Digest '04: SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08: SID International Symposium Digest of Technical Papers, May 20, 2008, vol. 39, pp. 621-624.

Prins.M et al "A Ferroelectric Transparent Thin-Film Transistor,", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N. et al., "Syntheses and Single-Crystal Data of Homologous Compounds, In2O3(ZnO)$m$ (m=3, 4, and 5), InGaO3(ZnO)3, and Ga2O3(ZnO)$m$ (m=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09: SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)$m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08: SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09: SID International Symposium Digest of Technical Papers, May 31, 2009, vol. 40, pp. 899-902.

Kanno.H et al., "White Stacked Electrophosphorecent Organic Light-Emitting Devices Employing MoO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02: Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08: SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits, 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition: The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09: SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09: SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09: SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs,"IDW '09: Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDS,", Journal of the SID, 2007, vol. 15, No. 1, pp. 17-22.

Hosono.H, "68.3:Invited Paper: Transparent Amorphous Oxide Semiconductors for High Performance TFT,", SID Digest '07: SID International Symposium Digest of Technical Papers, 2007, vol. 38, pp. 1830-1833.

Godo.H et al., "P-9: Numerical Analysis on Temperature Dependence of Characteristics of Amorphous In—Ga—Zn-Oxide TFT,", SID Digest '09: SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09: SID International Symposium Digest of Technical Papers, May 31, 2009, pp. 284-287.

Miyasaka.M, "SUFTLA Flexible Microelectronics on Their Way to Business,", SID Digest '07: SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09: SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09: SID International Symposium Digest of Technical Papers, May 31, 2009, pp. 395-398.

Lee.H et al., "Current Status of, Challenges to, and Perspective View of AM-OLED ,", IDW '06: Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07: SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel, YbFe2O4, and Yb2Fe3O7 Types of Structures for Compounds in the In2O3 and Sc2O3—A2O3—Bo Systems [A; Fe, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks,", Liquid Crystals, 1993, vol. 14; No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08: SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08: SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08: Proceedings of the 6th International Display Workshops, Dec. 3, 2008, pp. 581-584.

Kim.S et al., "High-Performance oxide thin transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors with Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letts), Sep. 1, 2003, vol. 83, No. 9, pp. 1755-1757.

T. Nishi et al., "P-143: Possibility of Reflective LC Display Using Oxide Semiconductor TFTs as Electronic Paper Display", SID Digest '10: SID International Symposium Digest of Technical Papers, 2010, pp. 1685-1688.

S. Amano et al., "43.4: Low Power LC Display Using In—Ga—Zn-Oxide TFTs Based on Variable Frame Frequency", SID Digest '10: SID International Symposium Digest of Technical Papers, 2010, pp. 626-629.

H. Godo et al., "Modeling and Measurement of Ultra-low Leakage Current of IGZO TFTs and New Driving Method of LCDs", IDW '10: Proceedings of the 16th International Display Workshops, 2010, pp. 235-238.

* cited by examiner

FIG. 3

| | | WRITING<br>element (1,1) = "1"<br>element (1,2) = "0" | READING<br>element (1,1) = "1"<br>element (1,2) = "0" |
|---|---|---|---|
| S1_(1) | V2<br>0V | ⎯⎯⎛‾‾‾‾‾⎞⎯⎯ | ------------------- |
| S1_(2) | V1<br>0V | ------------------- | ------------------- |
| S2_(1) | VH<br>0V<br>VL | ⎯⎯⎛‾‾‾‾‾⎞⎯⎯ | ------------------- |
| S2_(2) | VH<br>0V<br>VL | ------------------- | ⎯⎯⎝__⎠⎯⎯ |
| BL(1) | V1<br>0V | ------------------- | ------------------- |
| BL(2) | V1<br>0V | ------------------- | ⎯⎛‾‾‾‾▓▓⎞ |
| WL(1) | VH<br>0V<br>VL | ------------------- | ------------------- |
| WL(2) | VH<br>0V<br>VL | ------------------- | ⎯⎯⎝__⎠⎯⎯ |
| SL(1),SL(2) | V1<br>0V | ------------------- | ------------------- |
| D(1) | V1<br>0V | high impedance | ——————————— |
| D(2) | V1<br>0V | high impedance | ⎯⎛‾‾⎞▓⎯ |
| BW(1) | VH<br>0V<br>VL | ------------------- | ------------------- |
| BW(2) | VH<br>0V<br>VL | ------------------- | ------------------- |

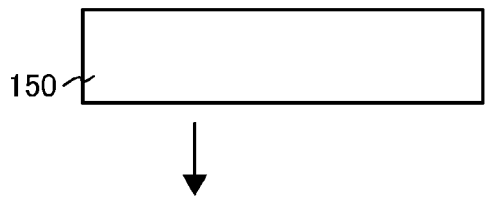
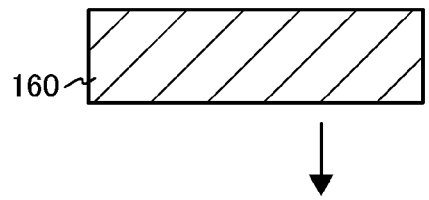
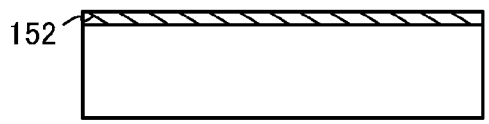
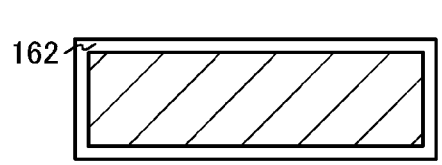
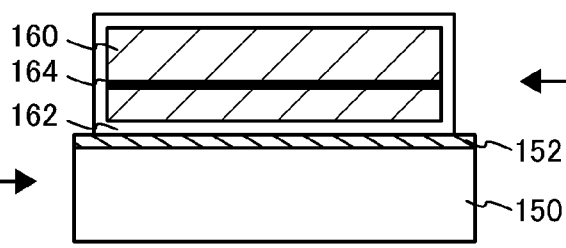
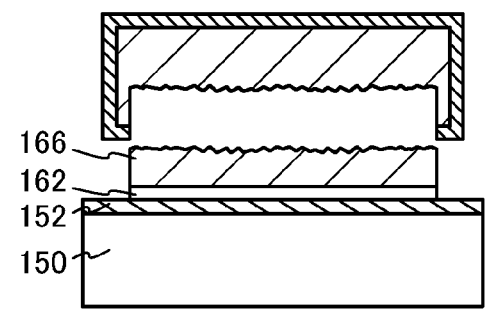
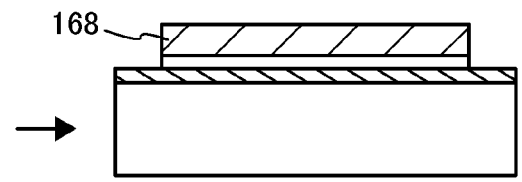

US 8,541,846 B2

SEMICONDUCTOR DEVICE

TECHNICAL FIELD

An embodiment of the present invention relates to a semiconductor device, particularly a semiconductor device including a memory element and an inversion element.

BACKGROUND ART

In recent years, metal oxides having semiconductor characteristics (hereinafter, referred to as oxide semiconductors) have attracted attention. The metal oxides having semiconductor characteristics can be applied to transistors (Patent Document 1 and Patent Document 2).
[Reference]
[Patent Document 1] Japanese Published Patent Application No. 2007-1203861
[Patent Document 2] Japanese Published Patent Application No. 2007-096055

DISCLOSURE OF INVENTION

An object of one embodiment of the present invention is to control the threshold voltage of at least one of a plurality of transistors which are highly integrated in an element. Further, an object of one embodiment of the present invention is to provide a structure which enables control of the threshold voltage of a transistor without complicating a manufacturing process.

One embodiment of the present invention is an element in which a plurality of transistors are longitudinally stacked. At least a transistor in an upper portion includes metal oxide having semiconductor characteristics. Part of the same layer as a gate electrode of a transistor in a lower portion is provided to overlap with a channel formation region of the transistor in an upper portion, so that the part of the same layer as the gate electrode functions as a back gate of the transistor in an upper portion.

Here, the transistor in a lower portion is subjected to planarization treatment on the condition of being covered with an insulating layer, whereby the gate electrode of the transistor in a lower portion is exposed and connected to a layer functioning as a source or drain electrode of the transistor in an upper portion.

Note that the part functioning as the back gate is not overlapped with a semiconductor layer in a lower portion; thus the insulating layer is left over the part functioning as the back gate, and the part of the same layer as the gate electrode of the transistor in a lower portion and a semiconductor layer of the transistor in an upper portion overlap with each other with the insulating layer interposed therebetween.

The threshold voltage of at least one of a plurality of transistors which are highly integrated in an element can be controlled. Furthermore, such a control of the threshold voltage of the transistor can be achieved without complicating the manufacturing process.

BRIEF DESCRIPTION OF DRAWINGS

FIG. 3 is a timing chart showing operation of the memory device of FIG. 2.
FIGS. 5A to 5H illustrate a manufacturing method of a memory element according to Embodiment 1.

BEST MODE FOR CARRYING OUT THE INVENTION

Embodiments of the present invention will be described in detail with reference to drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.
(Embodiment 1)

In this embodiment, a semiconductor device which is one embodiment of the present invention will be described. As the semiconductor device, a memory device is specifically described in this embodiment.

Figure 1A:
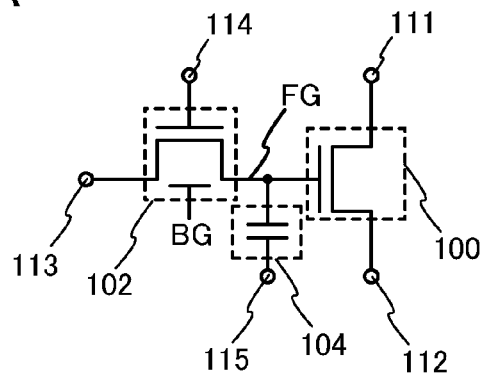
FIGS. 1A to 1C illustrate a memory element according to Embodiment 1.

FIG. 1A is an example of a circuit diagram of a memory element included in the memory device of this embodiment.

The memory element illustrated in FIG. 1A includes a transistor 100, a transistor 102, and a capacitor 104. In FIG. 1A, one of source and drain electrodes of the transistor 100 is electrically connected to a first wiring 111, and the other of the source and drain electrodes of the transistor 100 is electrically connected to a second wiring 112. One of source and drain electrodes of the transistor 102 is electrically connected to a third wiring 113, and a gate electrode of the transistor 102 is electrically connected to a fourth wiring 114. Then, a gate electrode of the transistor 100 and the other of the source and drain electrodes of the transistor 102 are electrically connected to one of electrodes of the capacitor 104. The other electrode of the capacitor 104 is electrically connected to a fifth wiring 115. The transistor 102 is further provided with a back gate BG functioning as another gate electrode.

Here, a transistor including an oxide semiconductor in a channel formation region is employed as the transistor 102. The transistor including an oxide semiconductor is highly purified by removal of hydrogen and water, whereby the off-state current can be significantly decreased. Therefore, electric charges given to the gate electrode of the transistor 100 can be held for an extremely long time by turning off the transistor 102. Further, provision of the capacitor 104 facilitates holding of electric charges given to the gate electrode of the transistor 100 and reading out of held data.

Operations of writing data, holding data, and reading out data in the memory element illustrated in FIG. 1A are described below.

First, the transistor 102 is turned on by supplying potential of the fourth wiring 114, and then electric charges supplied from the third wiring 113 are supplied to the gate electrode of the transistor 100 and the one of the electrodes of the capacitor 104. In other words, electric charges are supplied to a floating gate portion (FG portion in FIG. 1A) where the other of the source and drain electrodes of the transistor 102, the one of the electrodes of the capacitor 104, and the gate electrode of the transistor 100 are electrically connected (writing operation). Either of two types of electric charges having different potential levels is supplied here. Electric charges having low potential level are referred to as "low-level electric charge", and electric charges having high potential level are referred to as "high-level electric charge".

After that, the transistor 102 is turned off by supplying potential of the fourth wiring 114, so that electric charges at the FG portion of FIG. 1A are held (holding operation). The off-state current of the transistor 102 can be significantly decreased; thus, the electric charges stored in the FG portion can be held for a long time.

Next, reading of data will be described. By supplying an appropriate potential (reading potential) to the fifth wiring 115 while a predetermined potential (constant potential) is supplied to the first wiring 111, the potential of the second wiring 112 varies depending on the amount of electric charges held in the FG portion (potential of the gate electrode of the transistor 100). This is because in general, when the transistor 100 is an n-channel transistor, an "apparent threshold voltage $V_{th\_H}$" in the case where a high-level electric charge is given to the gate electrode of the transistor 100 is lower than an "apparent threshold voltage $V_{th\_L}$" in the case where a low-level electric charge is given to the gate electrode of the transistor 100. Here, an "apparent threshold voltage" refers to the potential of the fifth wiring 115, which is needed to turn on the transistor 100 when the first wiring 111 has a constant potential. Thus, when the potential of the fifth wiring 115 is set to a potential $V_0$ intermediate between $V_{th\_H}$ and $V_{th\_L}$, electric charges given to the gate electrode of the transistor 100 can be determined. For example, in the case where a high-level electric charge is given, when the potential of the fifth wiring 115 is set to $V_0$ ($>V_{th\_H}$), the transistor 100 is turned on. In the case where a low-level electric charge is given, when the potential of the fifth wiring 115 is set to $V_0$ ($<V_{th\_L}$), the transistor 100 remains in an off state. Therefore, the held data can be judged and read out with reference to the potential of the second wiring 112.

Note that in the case where memory elements are arranged in matrix, data of only the desired memory element is read out. In order to read data of only the desired memory element and not to read data of the other memory elements, in the case where the transistors 100 are connected in parallel among the memory elements, a potential which allows the transistors 100 to be turned off (potential lower than $V_{th\_H}$) regardless of a state of the gate electrode may be supplied to the fifth wirings 115 in the memory elements whose data are not to be read. On the other hand, in the case where the transistors 100 are connected in series among the memory elements, a potential which allows the transistors 100 to be turned on (potential higher than $V_{th\_L}$) regardless of a state of the gate electrode may be supplied to the fifth wirings 115 in the memory elements whose data are not to be read.

Next, rewriting of data is described. Rewriting of data is performed in a manner similar to that of the writing and holding of data. That is, the transistor 102 is turned on by potential of the fourth wiring 114. Thus, the potential of the third wiring 113 (a potential related to new data) is supplied to the FG portion. After that, the transistor 102 is turned off by potential of the fourth wiring 114; thus, electric charge with potential level related to new data is given to the FG portion.

In the memory element illustrated in FIG. 1A, data can be directly rewritten by overwriting data as described above. For that reason, high voltage with which electric charge is extracted from a floating gate in a flash memory or the like is not necessary, and a decrease in operating speed due to injection of an electric charge to a floating gate and removal of an electric charge from a floating gate can be suppressed.

Note that the other of the source and drain electrodes of the transistor 102 and the gate electrode of the transistor 100 are electrically connected, whereby the FG portion in FIG. 1A has a function equivalent to that of a floating gate of a flash memory.

When the transistor 102 is off, the FG portion can be regarded as being embedded in an insulator and electric charges can be stored in the FG portion. The transistor 102 provided in the memory element illustrated in FIG. 1A includes a channel formation region formed using an oxide semiconductor, and the off-state current of the transistor 102 can be about 100000 times as low as that of the conventional transistor 102 including silicon or the like. Thus, it can be assumed that leakage of electric charges from the FG portion through the transistor 102 hardly occurs. Therefore, with use of the memory element illustrated in FIG. 1A, a nonvolatile memory device which can hold data even without supply of power can be provided.

For example, when the off-state current of the transistor 102 is 10 zA/μm or less at room temperature and the capacitance value of the capacitor 104 is approximately 10 fF, data can be held for at least $10^4$ seconds or longer. Note that this data holding time depends on characteristics of the transistor 102 and the capacitance value of the capacitor 104.

Further, in the memory element illustrated in FIG. 1A, tunneling current does not flow in an insulating layer between the channel formation region and the FG portion and thus, the insulating layer does not deteriorate, which differs from a flash memory. Therefore, there is no limitation on the number of writing operations. Furthermore, a high voltage needed for writing or erasing in a conventional floating gate transistor is not necessary.

When the gate leakage of the transistor 102 is sufficiently low, an electric charge holding period (also referred to as a data holding period) is determined depending on the off-state current of the transistor 102 mainly, in such a condition that $R_1$ is higher than $R_{OS}$ and $R_2$ is higher than $R_{OS}$, where $R_{OS}$ indicates the resistance value (also referred to as effective resistance) between the source electrode and the drain electrode of when the transistor 102 is off, $R_1$ indicates the resistance value of an insulating layer included in the capacitor 104, and $R_2$ indicates the resistance value of the gate insulating layer of the transistor 100.

On the other hand, when the conditions are not satisfied, it is difficult to sufficiently secure the holding period even if the off-state current of the transistor 102 is decrease enough. This is because a leakage current other than the off-state current of the transistor 102 (e.g., a leakage current generated between the source electrode and the gate electrode) is large. Thus, in the memory element illustrated in FIGS. 1A to 1C, the preferable resistance relation is that $R_1$ is higher than $R_{OS}$ and $R_2$ is higher than $R_{OS}$.

Further, the capacitance value $C_1$ of the capacitor 104 is equal to or higher than the capacitance value $C_2$ of the transistor 100. When $C_1$ is higher, variation in the potential of the fifth wiring 115 can be suppressed when the potential of the FG portion is controlled by the fifth wiring 115 (e.g., at the time of reading).

Note that the resistance values $R_1$ and $R_2$ and the capacitance values $C_1$ and $C_2$ are determined depending on materials and the thicknesses of the gate insulating layers provided in the transistor 100 and the transistor 102 and the insulating layer of the capacitor 104, and the like.

The FG portion of the memory element illustrated in FIG. 1A has a function similar to that of a floating gate of a flash memory. However, a feature of the FG portion is essentially different from that of a floating gate of a flash memory. In the case of a flash memory, since voltage applied to a control gate is high, it is necessary to keep a proper distance between memory elements in order to prevent the potential from affecting a floating gate of a memory element of the adjacent cell. Providing a proper distance between the memory elements as described prevents high integration of a memory device.

Furthermore, in the flash memory, an insulating layer deteriorates by tunneling current, and the number of times of rewriting operations is restricted.

The memory element illustrated in FIG. 1A operates with switching of the transistors, and injection of electric charges by tunneling current is not performed, which is different from the flash memory. That is, a high electrical field for charge injection is not necessary unlike a flash memory. Thus, there is no concern about effect of high electrical field from the control gate on the memory element of the adjacent cell, and higher integration can be achieved as compared to the conventional one. Moreover, since a high electric field is unnecessary, a booster circuit is unnecessary at least for the memory element. Therefore, a large-sized peripheral circuit is not necessary, and the frame of a memory device can be narrowed.

In the flash memory, electric charges travel in a gate insulating layer (a tunnel insulating film) during writing operation, so that deterioration of the gate insulating layer cannot be avoided. In contrast, the memory element illustrated in FIG. 1A, data is written by switching operation of a writing transistor; there is no cause of deterioration of the gate insulating layer. This means that there is no limit on the number of times of writing in principle and writing durability is very high. That is, the memory element illustrated in FIG. 1A has higher durability and reliability than the flash memory. For example, in the memory element illustrated in FIG. 1A, writing operation can be performed $1 \times 10^9$ times (one billion times) or more, further preferably, $1 \times 10^{11}$ (one hundred billion times).

In the case where the relative permittivity $E_d$ of the insulating layer in the capacitor 104 is larger than or equal to the relative permittivity $\epsilon_{r2}$ of the insulating layer in the transistor 100, it is preferable that the following conditions be satisfied; $S_1$ is smaller than or equal to twice $S_2$ ($2S_2 \geq S_1$, further preferably, $S_1$ is smaller than or equal to $S_2$) where $S_1$ indicates an area of the capacitor 104 and $S_2$ indicates an area of a capacitor in the transistor 100; and the capacitance value $C_2$ is lower than the capacitance value $C_1$. This is because higher integration can be realized. For example, a stack of a film formed of a high-k material such as hafnium oxide and a film formed of an oxide semiconductor is used for the insulating layer in the capacitor 104 so that $\epsilon_{r1}$ can be 10 or more, preferably 15 or more; silicon oxide is used for the insulating layer of a capacitor in the transistor 100 so that $\epsilon_{r2}$ can be 3 to 4.

Note that, although description here is made on the case of using an n-channel transistor in which electrons are majority carriers, a p-channel transistor in which holes are majority carriers may be used.

Figure 1B:
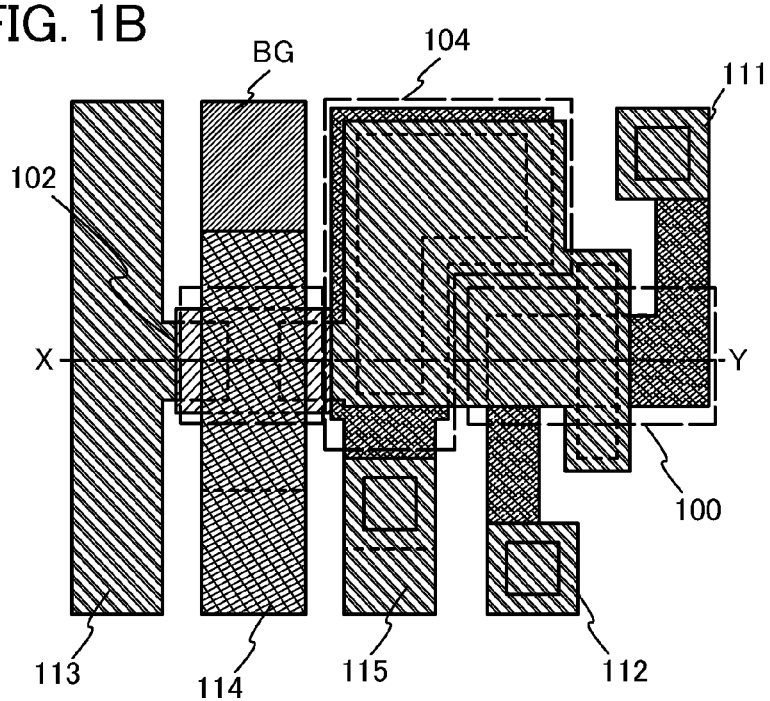
Figure 1C:
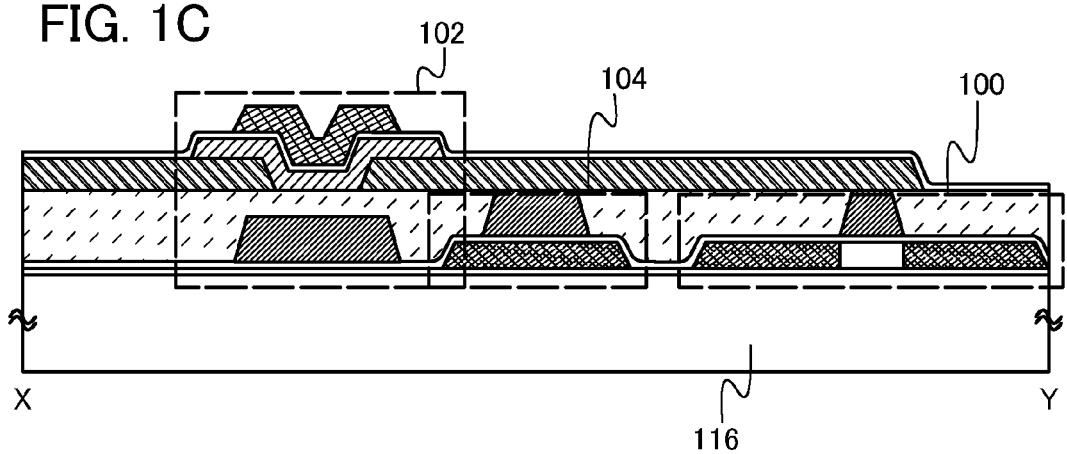

FIG. 1B is a top view illustrating an example of a specific structure of the memory element of FIG. 1A. FIG. 1C is a cross-sectional view taken along line X-Y of FIG. 1B.

In FIG. 1C, the transistor 100 and the capacitor 104 are provided over a substrate 116. The transistor 100 and the capacitor 104 are covered with an insulating layer, and the insulating layer is planarized by chemical mechanical polishing (CMP) treatment or the like, so that the gate electrode of the transistor 100 and the one of the electrodes of the capacitor 104 are exposed. The other of the source and drain electrodes of the transistor 102 is provided over the exposed gate electrode of the transistor 100 and the one of the electrodes of the capacitor 104. Note that the transistor 100 here is a p-channel transistor, but it is not limited thereto.

As illustrated in FIG. 1C, part of the same layer as the gate electrode of the transistor 100 (part functioning as a back gate of the transistor 102) overlaps with at least a portion functioning as a channel formation region in the semiconductor layer of the transistor 102. The part functioning as the back gate of the transistor 102 and the semiconductor layer of the transistor 102 are provided so that an insulating layer provided over the transistor 100 is sandwiched therebetween. This insulating layer is a portion of the insulating layer which has been provided over the transistor 100 and left after the planarization treatment, due to a lack of the thickness of a semiconductor layer of the transistor 100. As described above, the transistor in an upper portion and the back gate are provided with the insulating layer which is left after the planarization treatment and interposed therebetween, and the back gate is formed of part of the same layer as the gate electrode of the transistor in a lower portion, which are one of features of the memory element that is one embodiment of the present invention. In such a manner, the back gate of the transistor in the upper portion is formed of the same layer as the gate electrode of the transistor in a lower portion, whereby the back gate electrode of the transistor in an upper portion can be provided without an increase in the number of manufacturing steps. Note that in this specification and the like, the term "the same layer as A" indicates a layer formed from the same material in the same step as those of A.

The off-state current of the transistor 102 per micrometer of channel width at temperature in use (e.g., 25° C.) is 100 zA or less, preferably 10 zA or small, further preferably 1 zA or less, still further preferably 100 yA or less. Such a low off-state current can be achieved with use of an oxide semiconductor for the transistor 102. Note that the off-state current may be lower than the measurement limit.

In addition, by using an oxide semiconductor in the channel formation region of the transistor 102, the subthreshold swing (S value) is reduced, so that the switching rate can be sufficiently high. Thus, in the transistor 102 whose channel formation region is formed using an oxide semiconductor, rising of a writing pulse given to the FG portion can be very sharp.

As described above, since the off-state current of the transistor 102 is decreased, the amount of electric charges stored in the FG portion can be reduced. Furthermore, operation speed of writing data and erasing data can be increased; thus, rewriting data can be performed at high speed.

As for the transistor 100, it is preferable to use a transistor which operates at high speed in order to increase the reading rate. For example, it is preferable to use a transistor with a switching rate of 1 nanosecond or faster as the transistor 100.

Writing data is performed as follows: the transistor 102 is turned on; potential is supplied to the FG portion where the other of the source and drain electrodes of the transistor 102, the one of the electrodes of the capacitor 104, and the gate electrode of the transistor 100 are electrically connected; and then the transistor 102 is turned off, so that the predetermined amount of electric charges are held in the FG portion. Here, the off-state current of the transistor 102 is much decreased; thus, the electric charges supplied to the FG portion are held for a long time. For example, when the off-state current is low enough to be regarded as substantially zero, refresh operation is not needed, or even when the refresh operation is performed, the frequency of refresh operation can be drastically low (e.g., about once a month or a year), so that power consumed by the memory element can be significantly reduced.

Note that in the memory element of FIGS. 1A to 1C, by overwriting data, data can be directly rewritten. Therefore, the memory element does not need erasing operation which is necessary in a flash memory and the like, so that a decrease in operation speed due to erasing operation can be prevented.

The maximum value of the voltage applied to the memory element of FIGS. 1A to 1C (the difference between the highest potential and the lowest potential applied to respective terminals of the memory element at the same time) is 5 V or lower, preferably 3 V or lower in one memory element, in the case where tow-stage (one bit) data is written.

Further, the oxide semiconductor used for the transistor 102 has an energy gap as large as 3.0 eV to 3.5 eV, which is considered to be one of main factors of low off-state current of the transistor 102.

The oxide semiconductor used in the transistor 102 has very few thermally excited carriers; thus, even under a high-temperature environment at 150° C., current-voltage characteristics of the memory element are not degraded.

For the transistor 102, it is preferable to use an intrinsic (i-type) or substantially intrinsic oxide semiconductor which is highly purified by removal of an impurity so that an impurity serving as a carrier donor other than a main component of the oxide semiconductor is contained as little as possible.

As described, a highly purified oxide semiconductor layer includes extremely few carriers (close to zero), and the carrier concentration thereof is lower than $1 \times 10^{14}/cm^3$, preferably lower than $1 \times 10^{12}/cm^3$, further preferably lower than $1 \times 10^{11}/cm^3$. This is considered to be one of factors of low off-state current of the transistor 102.

Such a highly-purified oxide semiconductor is extremely sensitive to an interface level and interface charge; therefore, an interface between the oxide semiconductor layer and the gate insulating layer is important. Thus, the gate insulating layer which is in contact with the highly purified oxide semiconductor needs high quality.

The gate insulating layer formed by, for example, high-density plasma CVD using microwave (for example, a frequency of 2.45 GHz) can be a dense layer with high withstand voltage, which is preferable. The highly purified oxide semiconductor and the high-quality gate insulating layer are provided to be in close contact with each other, so that the interface state density can be reduced and favorable interface characteristics can be obtained.

It is needless to say that another film formation method such as a sputtering method or a plasma CVD method can be employed as long as a high-quality insulating layer can be formed as a gate insulating layer.

As an oxide semiconductor used in the transistor 102, the following metal oxide can be used: four-component metal oxide such as an In—Sn—Ga—Zn—O-based oxide semiconductor; three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, an In—Mg—O-based oxide semiconductor, or an In—Ga—O-based oxide semiconductor; a single component metal oxide such as an In—O-based oxide semiconductor, a Sn—O-based oxide semiconductor, or a Zn—O-based oxide semiconductor; or the like. Further, silicon oxide may be contained in the above oxide semiconductor. Here, for example, an In—Ga—Zn—O-based oxide semiconductor means an oxide film containing indium (In), gallium (Ga), and zinc (Zn), and there is no particular limitation on the composition ratio thereof Further, the In—Ga—Zn—O-based oxide semiconductor may contain an element other than In, Ga, and Zn.

For the oxide semiconductor film in the transistor 102, a thin film of an oxide semiconductor represented by the chemical formula, $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. In addition, the above oxide semiconductor thin film may contain silicon oxide.

The oxide thin film can be formed by a sputtering method. Here, with use of an oxide target whose composition ratio of $In_2O_3:Ga_2O_3:ZnO=1:1:1$ [molar ratio], an In—Ga—Zn—O film can be formed, for example. Alternatively, an oxide target having a composition ratio of $In_2O_3:Ga_2O_3:ZnO=1:1:2$ [molar ratio] may be used.

Note that here, for example, an In—Ga—Zn—O film means an oxide film containing In, Ga, and Zn, and there is no particular limitation on the composition ratio thereof.

In the case where an In—Zn—O-based material is used as an oxide semiconductor, a target therefore has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied.

The filling factor of the oxide target is greater than or equal to 90% and less than or equal to 100%, preferably greater than or equal to 95% and less than or equal to 99.9%. With use of an oxide target with high filling factor, an oxide semiconductor film which is a dense film can be formed.

Moreover, the oxide semiconductor film is preferably formed by a sputtering method in a rare gas atmosphere, an oxygen atmosphere, or a mixed atmosphere of a rare gas and oxygen. Further, a high-purity gas from which an impurity such as hydrogen, water, hydroxyl, or hydride is removed is preferably used as a sputtering gas used in formation of the oxide semiconductor film.

Figure 2:
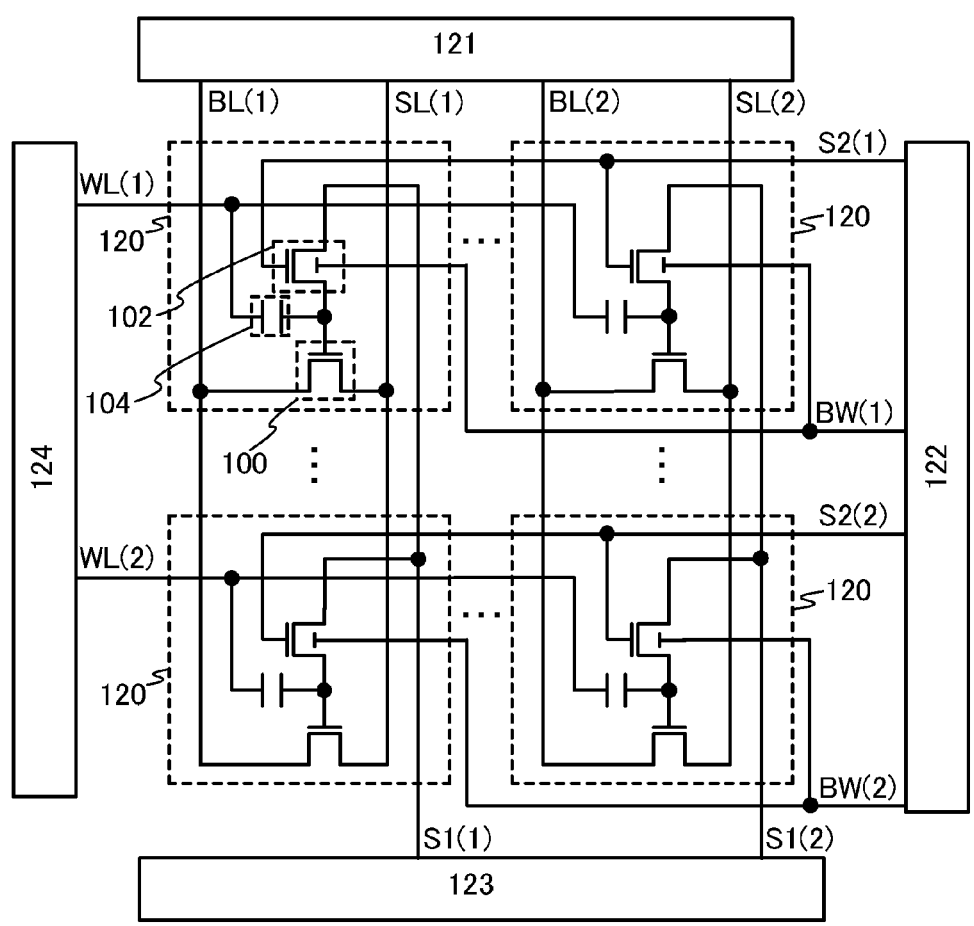
FIG. 2 is a diagram of a memory device including a memory element according to Embodiment 1.

FIG. 2 illustrates a structural example of a memory device in which the memory elements described with FIGS. 1A to 1C are provided in matrix, as a memory device which is one embodiment of the present invention. Although FIG. 2, for simplicity, illustrates a structure where the memory elements are arranged in matrix of 2 (rows) (in a horizontal direction)×2 (columns) (in a vertical direction), a memory device in which memory elements are arranged in matrix of m (rows)

(in a horizontal direction)×n (columns) (in a vertical direction) (m and n are natural numbers) is described below.

In the memory device illustrated in FIG. 2, a plurality of memory elements 120 are arranged in matrix of m (rows) (in a horizontal direction)×n (columns) (in a vertical direction) (m and n are natural numbers), and on a periphery thereof, a first driver circuit 121, a second driver circuit 122, a third driver circuit 123, and a fourth driver circuit 124 are provided. These driver circuits and the memory elements 120 are connected with m word lines WL, m second signal lines S2, m back gate lines BW, n bit lines BL, n source lines SL, and n first signal lines S1. Here, the memory element 120 is the memory element illustrated in FIG. 1A, which includes the transistor 100, the transistor 102, and the capacitor 104.

The bit line BL corresponds to the second wiring 112 of the memory element illustrated in FIG. 1A, the source line SL corresponds to the first wiring 111 of the memory element illustrated in FIG. 1A, the first signal line S1 corresponds to the third wiring 113 of the memory element illustrated in FIG. 1A, the second signal line S2 corresponds to the fourth wiring 114 of the memory element illustrated in FIG. 1A, and the word line WL corresponds to the fifth wiring 115 of the memory element illustrated in FIG. 1A.

In other words, in the memory element 120, the one of the source and drain electrodes of the transistor 100 is electrically connected to the source line SL, the other of the source and drain electrodes of the transistor 100 is electrically connected to the bit line BL. The one of the source and drain electrodes of the transistor 102 is electrically connected to the first signal line S1, and a gate electrode of the transistor 102 is electrically connected to the second signal line S2. A gate electrode of the transistor 100 and the other of the source and drain electrodes of the transistor 102 are electrically connected to the one of the electrodes of the capacitor 104. The other electrode of the capacitor 104 is electrically connected to the word line WL. A back gate BG provided in the transistor 102 is electrically connected to the back gate line BW.

The memory elements 120 are connected in parallel between the source lines SL and the bit lines BL. For example, the memory element 120 of an i-th row and a j-column (i,j) (i is an integer which is larger than or equal to 1 and smaller than or equal to m, and j is an integer which is larger than or equal to 1 and smaller than or equal to n) is connected to the source line SL(j), the bit line BL(j), the first signal line S1(j), the word line WL(i), the second signal line S2(i), and the back gate line BW (i).

The source lines SL and the bit lines BL are connected to the first driver circuit 121, the second signal lines S2 and the back gate lines BW are connected to the second driver circuit 122, the first signal lines S1 are connected to the third driver circuit 123, and the word lines WL are connected to the fourth driver circuit 124.

Note that the first driver circuit 121, the second driver circuit 122, the third driver circuit 123 and the fourth driver circuit 124 are independently provided here; however, the periphery circuit structure is not limited to this, a decoder having one or more functions may also be used.

Next, the writing operation and the reading operation of the memory device illustrated in FIG. 2 are described with reference to a timing chart of FIG. 3.

Although operation of the memory device of two rows by two columns will be described for simplification, the present invention is not limited to this.

In FIGS. 3, S1(1) and S1(2) are potentials of the first signal lines S1; S2(1) and S2(2) are potentials of the second signal lines S2; BL(1) and BL(2) are potentials of the bit lines BL; WL(1) and WL(2) are potentials of the word lines WL; and SL(1) and SL(2) are potentials of the source lines SL.

Is described the case where data is written to the memory element 120 (1,1) and the memory element 120 (1,2) of the first row and data is read from the memory element 120 (1,1) and the memory element 120 (1,2) of the first row. Note that the description below is about the case where data written to the memory element 120 (1,1) is "1" (which can supply a high level electric charge to the FG portion) and data written to the memory element (1,2) is "0" (which can supply a low level electric charge to the FG portion).

First, the writing will be described. In a writing period of the first row, a potential $V_H$ is supplied to the second signal line S2(1) of the first row so that the second transistors 102 of the first row are on. Further, a potential of 0 V is supplied to the second signal line S2(2) of the second row so that the second transistors 102 of the row other than the first row are turned off.

Next, the potential $V_2$ and the potential 0 V are applied to the first signal line S1(1) of the first column and the first signal line S1(2) of the second column, respectively.

As a result, the FG portion of the memory element (1,1) is supplied with the potential $V_2$, and the FG portion of the memory element (1,2) is supplied with 0V. Here, the potential $V_2$ is higher than the threshold voltage of the transistor. Then, the potential of the second signal line S2(1) of the first row is set to the potential 0 V, so that the transistors 102 of the first row are turned off. Thus, the writing is completed.

Note that the word lines WL(1) and WL(2) are at a potential of 0 V. Further, before the potential of the first signal line S1(1) of the first column is changed, the potential of the second signal line S2(1) of the first row is set to 0 V. After the writing, the threshold voltage of a memory element is $V_{w0}$ in the case where data "0" has been written and $V_{w1}$ in the case where data "1" has been written, assuming that a terminal electrically connected to the word line WL is a control gate electrode, the source electrode of the transistor 100 is a source electrode, and the drain electrode of the transistor 102 is a drain electrode, in the memory element. Here, the threshold voltage of the memory element means a voltage of a terminal connected to the word line WL, which changes resistance between the source electrode and the drain electrode of the transistor 100. Note that $V_{w0}>0>V_{w1}$ is satisfied.

Then, the reading will be described. In a reading period of the first row, a potential 0 V and the potential $V_L$ are supplied to the word line WL(1) of the first row and the word line WL(2) of the second row, respectively. The potential $V_L$ is lower than the threshold voltage $V_{w1}$. When the word line WL(1) is set to 0 V, in the first row, the transistor 100 of the memory element 120 in which data "0" is held is turned off, and the transistor 100 of the memory element 120 in which data "1" is held is turned on. When the word line WL(2) is at the potential $V_L$, in the second row, the transistor 100 of the memory element 120 in which either data "0" or data "1" is held is off.

Next, a potential of 0 V is supplied to the source line SL(1) of the first column and the source line SL(2) of the second column.

As a result, the resistance between the bit line BL(1) and the source line SL(1) is low because the first transistor 100 in the memory element 120 (1,1) is on, and the resistance between the bit line BL(2) and the source line SL(2) is high because the transistor 100 in the memory element 120 (1,2) is off. A read-out circuit connected to the bit line BL(1) and the bit line BL(2) can read data on the basis of a difference in resistance between the bit lines BL.

Further, a potential of 0 V and the potential $V_L$ are supplied to the second signal line S2(1) and the second signal line S2(2), respectively, so that all the transistors 102 are off. The potentials of the FG portions of the first row are 0 V or $V_2$; thus, all the transistors 102 can be turned off by setting the potential of the second signal line S2(1) to 0 V. On the other hand, the potentials of the FG portions of the second row are lower than the potential at the time directly after data writing if the potential $V_L$ is supplied to the word line WL(2). Therefore, in order to prevent the transistor 102 from being turned on, the potential of the second signal line S2(2) is set to low similarly to the potential of the word line WL(2). Thus, all the transistors 102 can be turned off.

During the above operation, the back gate line BW(1) and the back gate line BW(2) may have high potential.

Figure 4A:
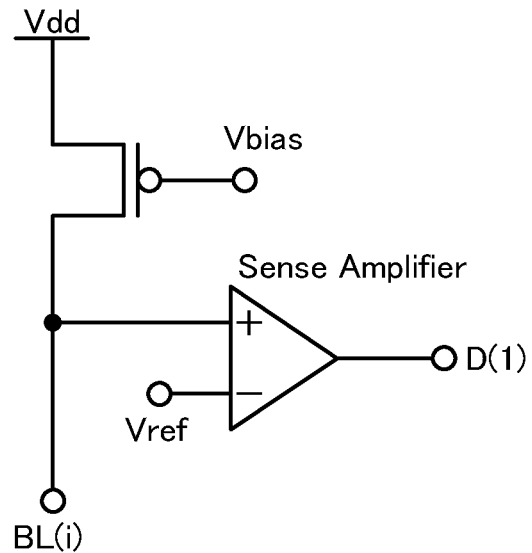
FIGS. 4A and 4B are diagrams each showing a read-out circuit in a memory device according to Embodiment 1.

A read-out circuit is used for reading data. FIG. 4A illustrates an example of a read-out circuit. The read-out circuit illustrated in FIG. 4A includes a transistor and a sense amplifier. The potential $V_{dd}$ is applied to one of source and drain of a transistor, and the other of the source and drain of the transistor is connected to a plus terminal of the sense amplifier and a bit line. The bias potential $V_{bias}$ is applied to a gate of the transistor. The bias potential $V_{bias}$ is higher than 0 and lower than $V_{dd}$. Further, the reference potential $V_{ref}$ is input to a minus terminal of the sense amplifier.

In the case where the memory element has low resistance, the potential input to the plus terminal of the sense amplifier is lower than the reference potential $V_{ref}$ and the sense amplifier outputs data "1". On the other hand, in the case where the memory element has high resistance, the potential input to the plus terminal of the sense amplifier is higher than the reference potential $V_{ref}$ and the sense amplifier outputs data "0". When the transistor 100 of the memory element (1,1) is on, resistance between the bit line BL(1) and the source line SL(1) is low. Thus, an input of the sense amplifier is low potential and an output D(1) becomes High. Meanwhile, when the transistor 100 of the memory element (1,2) is off, resistance between the bit line BL(2) and the source line SL(2) is high; thus, an input of the sense amplifier is high potential and an output D(2) becomes Low.

Figure 4B:
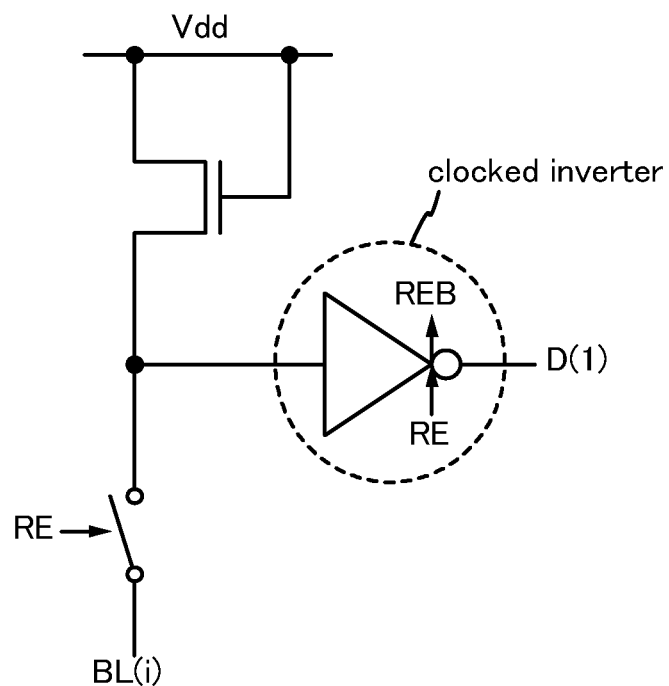

FIG. 4B illustrates another example of the read-out circuit. The read-out circuit illustrated in FIG. 4B includes a transistor and a clocked inverter. The potential $V_{dd}$ is applied to one of source and drain of the transistor, and the other of the source and drain of the transistor is electrically connected to an input of the clocked inverter and a bit line. The potential $V_{dd}$ is also applied to a gate of the transistor.

An output potential in the case of using the read-out circuit illustrated in FIG. 4B is described. When the transistor 100 of the memory element (1,1) is on, resistance between the bit line BL(1) and the source line SL(1) is low. Thus, the input of the clocked inverter has low potential and an output D(1) becomes High. Meanwhile, when the transistor 100 of the memory element (1,2) is off, resistance between the bit line BL(2) and the source line SL(2) is high, and thus, the input of the clocked inverter has high potential and an output D(2) becomes Low.

The structure of the read-out circuit is not limited to those in FIGS. 4A and 4B. For example, the read-out circuit may include a precharge circuit or a bit line for reference may be connected instead of applying the reference potential $V_{ref}$.

The memory device is not limited to that illustrated in FIG. 2 but may have a different structure including the memory element illustrated in FIGS. 1A to 1C, from that in FIG. 2.

Hereinafter, a method for manufacturing the memory element 120 is described with reference to FIGS. 5A to 5H, FIGS. 6A to 6G, and FIGS. 7A to 7D. First, an example of a method for manufacturing an SOI substrate provided with the transistor 100 is described with reference to FIGS. 5A to 5H.

First, a base substrate 150 is prepared (see FIG. 5A). As the base substrate 150, a substrate made of an insulator can be used. Specifically, as examples thereof, a glass substrate, a quartz substrate, a ceramic substrate and a sapphire substrate can be given.

Alternatively, a semiconductor substrate such as a single crystal silicon substrate or a single crystal germanium substrate may be used as the base substrate 150. In the case of using a semiconductor substrate as the base substrate 150, the temperature limitation for heat treatment is eased compared with the case of using a glass substrate or the like; thus, a high-quality SOI substrate is easily obtained. Here, as a semiconductor substrate, a solar grade silicon (SOG-Si) substrate or the like may be used. Alternatively, a polycrystalline semiconductor substrate may be used. In the case of using a SOG-Si substrate, a polycrystalline semiconductor substrate, or the like, manufacturing cost can be reduced as compared to the case of using a single crystal silicon substrate or the like.

In this embodiment, a glass substrate is used for the base substrate 150. Using a glass substrate as the base substrate 150 enables cost reduction.

Next, a nitrogen-containing layer 152 (e.g., a layer including an insulating film containing nitrogen, such as a silicon nitride film) is formed on a surface of the base substrate 150 (FIG. 5B). The nitrogen-containing layer 152 functions as a layer for bonding a single crystal semiconductor layer (a bonding layer). The nitrogen-containing layer 152 also functions as a barrier layer for preventing an impurity contained in the base substrate, such as sodium (Na), from diffusing into the single crystal semiconductor layer.

Here, it is preferable that the nitrogen-containing layer 152 have surface planarity at a certain level because the nitrogen-containing layer 152 is used to function as a bonding layer. Specifically, the nitrogen-containing layer 152 is formed such that it has an average surface roughness (arithmetic mean deviation) of 0.5 nm or less and a root-mean-square surface roughness of 0.60 nm or less, preferably an average surface roughness of 0.35 nm or less and a root-mean-square surface roughness of 0.45 nm or less. Note that the average surface roughness and root-mean-square surface roughness can be measured, for example, in a region of 10 square micrometers.

Next, a bond substrate 160 is prepared. A single crystal semiconductor substrate (e.g., a single crystal silicon substrate) is used as the bond substrate 160 (FIG. 5C). However, the bond substrate 160 is not limited thereto.

An oxide film 162 is formed on a surface of the bound substrate 160 (FIG. 5D). In view of removal of contamination, it is preferable that the surface of the bond substrate 160 be cleaned with a hydrochloric acid/hydrogen peroxide mixture (HPM) or the like before formation of the oxide film 162. The oxide film 162 can be formed with, for example, a single layer of a silicon oxide film, a silicon oxynitride film, or the like or a stack of any of the above films. The oxide film 162 is preferably formed using organosilane such as tetraethoxysilane (abbreviation: TEOS, chemical formula: $Si(OC_2H_5)_4$).

Next, the bond substrate 160 that is a single crystal semiconductor substrate is irradiated with ions accelerated by an electrical field so that the ions are added to the bond substrate 160, whereby an embrittled region 164 is formed at a predetermined depth in the bond substrate 160 that is a single crystal semiconductor substrate (FIG. 5E). The ion irradiation treatment is performed with an ion-doping apparatus or an ion-implantation apparatus. In the treatment, a gas containing hydrogen is used as a source gas. As for ions used for the irradiation, the proportion of $H_3^+$ is preferably set high. This is because efficiency of ion irradiation can be improved.

Note that the added ion is not limited to a hydrogen ion, and an ion of helium or the like may be added. Further, the added ion is not limited to one kind, and plural kinds of ions may be added. For example, in the case of performing irradiation with hydrogen and helium concurrently using an ion doping apparatus, the number of steps can be reduced as compared to the case of performing irradiation of hydrogen and helium in separate steps, and increase in surface roughness of a single crystal semiconductor layer to be formed later can be further suppressed.

The depth at which the embrittled region 164 is formed is determined by the kinetic energy, mass, charge amount, or incidence angle of the ions, or the like, which is almost the same as the average penetration depth of the ions. Therefore, the thickness of a single crystal semiconductor layer to be separated from the bound substrate 160 that is the single crystal semiconductor substrate can be controlled by the depth at which the ions are added.

Next, the surface of the base substrate 150 and the bond substrate 160 are disposed to face each other, and the surface of the nitrogen-containing layer 152 and the surface of the oxide film 162 are disposed in close contact with each other. In such a manner, the base substrate 150 and the bond substrate 160 are bonded to each other (FIG. 5F).

When the base substrate 150 and the bond substrate 160 are bonded, it is preferable that a pressure greater than or equal to 0.001 N/cm² and less than or equal to 100 N/cm² be applied to one part of the base substrate 150 or the bond substrate 160. By applying a pressure in such a manner, the nitrogen-containing layer 152 and the oxide film 162 are bonded at the portion where they are in contact with each other, and the bonding spontaneously spreads to the entire area. This bonding is performed under the action of the Van der Waals force or hydrogen bonding and can be performed at room temperature.

After the base substrate 150 and the bond substrate 160 are bonded, heat treatment may be performed in order to further strengthen the bond. This heat treatment is performed at a temperature at which separation at the embrittled region 164 does not occur (for example, higher than or equal to room temperature and lower than 400° C.). Alternatively, the nitrogen-containing layer 152 and the oxide film 162 may be bonded to each other while being heated at a temperature within this range.

Next, the bond substrate 160 is divided along the embrittled region 164 by heat treatment, so that a single crystal semiconductor layer 166 is formed over the base substrate 150 with the nitrogen-containing layer 152 and the oxide film 162 interposed therebetween (FIG. 5G).

The temperature of the heat treatment for separation is preferably low so as to suppress generation of roughness on the surface of the single crystal semiconductor layer 166. The temperature of the heat treatment for separation may be, for example, higher than or equal to 300° C. and lower than or equal to 600° C., and the temperature lower than or equal to 500° C. (higher than or equal to 400° C.) is more effective.

Note that after the bond substrate 160 is separated, the single crystal semiconductor layer 166 may be subjected to heat treatment at 500° C. or higher so that the concentration of hydrogen remaining in the single crystal semiconductor layer 166 is reduced.

Next, a surface of the single crystal semiconductor layer 166 is irradiated with laser light, whereby a semiconductor layer 168 where the flatness of the surface planarity is improved and the number of defects is reduced is formed. Note that instead of the laser light irradiation treatment, heat treatment may be performed.

Although the irradiation treatment with the laser light described is here performed just after the heat treatment for separation, the irradiation treatment with the laser light may be performed after a region having many defects in the surface of the single crystal semiconductor layer 166 is removed by etching or the like. Alternatively, the irradiation treatment with the laser light may be performed after a level of planarity of the surface of the crystal semiconductor layer 166 is improved.

Through the above steps, the SOI substrate including the semiconductor layer 168 can be obtained (FIG. 5H).

Next, a method for manufacturing a transistor with the above SOI substrate is described with reference to FIGS. 6A to 6G.

Figure 6A:
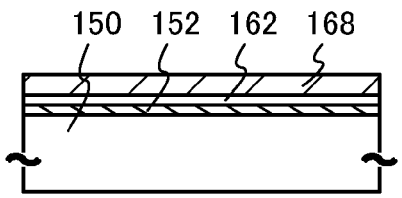
FIGS. 6A to 6G illustrate a manufacturing method of a memory element according to Embodiment 1.
Figure 6B:
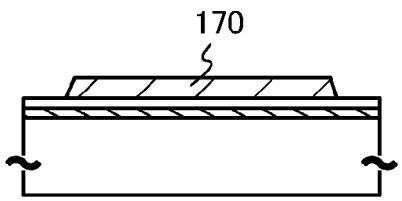

First, the semiconductor layer 168 illustrated in FIG. 6A is processed to have an island shape, so that a semiconductor layer 170 is formed (FIG. 6B).

Note that before or after processing the semiconductor layer 168 into the island-shaped layer, an impurity element imparting n-type conductivity or an impurity element imparting p-type conductivity may be added to the semiconductor layer 168 or the semiconductor layer 170 in order to control the threshold voltage of the transistor. In the case where a material of the semiconductor layer 168 is silicon, P, As, or the like can be used as an impurity element imparting n-type conductivity, and alternatively, B, Al, Ga, or the like can be used as an impurity element imparting p-type conductivity, for example.

Figure 6C:
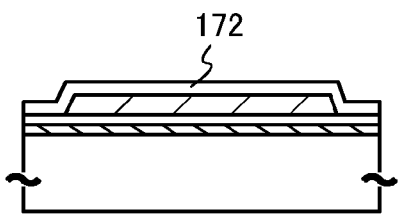

Next, an insulating layer 172 is formed to cover the semiconductor layer 170 (FIG. 6C). The insulating layer 172 functions as a gate insulating layer later.

Figure 6D:
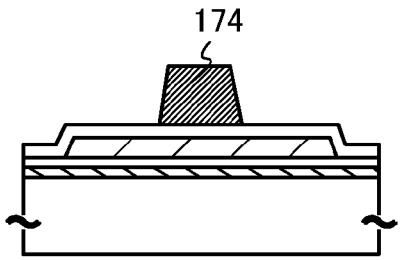

Next, a conductive layer is formed over the insulating layer 172; then, the conductive layer is selectively etched so that a gate electrode 174 is formed to overlap with the semiconductor layer 170 (FIG. 6D). In this step, the one of the electrodes of the capacitor 104 and the back gate BG of the transistor 102 as well as the gate electrode 174 can be also formed.

Figure 6E:
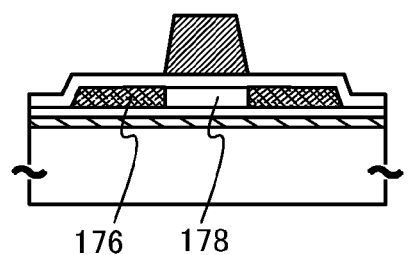

Next, with use of the gate electrode 174 as a mask, an impurity element imparting one conductivity type is added to the semiconductor layer 170, so that an impurity region 176 and a channel formation region 178 are formed (FIG. 6E). Note that in order to form a p-channel transistor in this embodiment, an impurity element such as B or Al is added; however, in the case of forming an n-channel transistor, P or As may be added. The impurity region 176 functions as a source region or a drain region.

Although not illustrated here, a sidewall insulating layer may be formed on the side surfaces of the gate electrode 174.

Figure 6F:
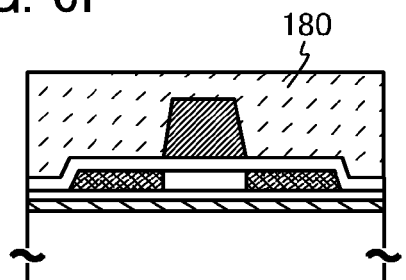

Then, an interlayer insulating layer 180 is formed so as to cover the components formed through the above steps (FIG. 6F). The interlayer insulating layer 180 may be formed using a material including an inorganic insulating material such as silicon oxide, silicon oxynitride, silicon nitride oxide, silicon nitride, hafnium oxide, aluminum oxide, or tantalum oxide; or an organic insulating material such as polyimide or acrylic. The interlayer insulating layer 180 may have a stacked structure.

Figure 6G:
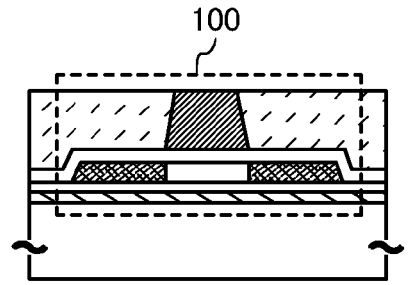

Next, a surface of the interlayer insulating layer 180 is planarized by CMP treatment, etching treatment, or the like (FIG. 6G). By the CMP or etching treatment, the gate electrode 174 is exposed.

Through the above-described steps, the transistor 100 with use of the SOI substrate can be formed. Since such a transistor 100 can operate at high speed, with such a transistor 100, a logic circuit (also referred to as an arithmetic circuit) or the like can be constituted. In other words, the transistor 100 can be used for a driver circuit of a memory device or the like.

Note that the structure of the transistor 100 is not limited to that illustrated in FIG. 6G, and an electrode, a wiring, an insulating layer, and the like are additionally formed in the transistor.

Next, a method for forming the transistor 102 over the transistor 100 is described with reference to FIGS. 7A to 7D.

Figure 7A:
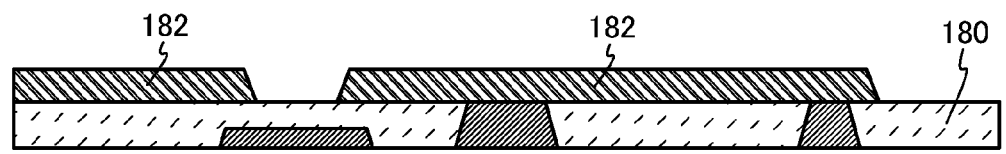
FIGS. 7A to 7D illustrate a manufacturing method of a memory element according to Embodiment 1.

First, a conductive layer is formed over the interlayer insulating layer 180 which has been subjected to planarization treatment as illustrated in FIG. 6G, and the conductive layer is processed into a conductive layer 182 (FIG. 7A). There is no particular limitation on a material and a formation method of the conductive layer 182. The conductive layer 182 is provided at least in a needed region so as to be in contact with the exposed portion of the gate electrode 174.

Figure 7B:
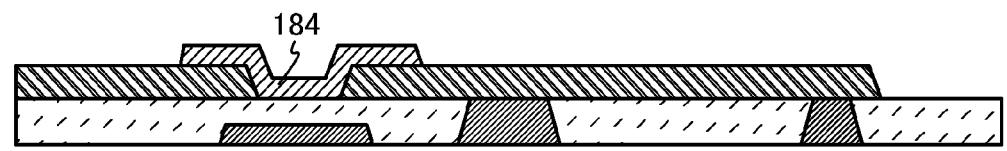

Next, a semiconductor film is formed over the conductive layer 182, and the semiconductor film is processed into a semiconductor layer 184 (FIG. 7B). Here, the semiconductor layer 184 is formed using an oxide semiconductor.

Dehydration or dehydrogenation may be performed by performing preheating before the semiconductor film is formed.

It is preferable that remaining moisture and hydrogen in a deposition chamber be sufficiently removed before the semiconductor film is formed. That is, before formation of the semiconductor film, evacuation is preferably performed with an entrapment vacuum pump such as a cryopump, an ion pump, or a titanium sublimation pump.

Next, first heat treatment may be performed on the oxide semiconductor layer. Here, the first heat treatment is performed in order to dehydrate or dehydrogenate the oxide semiconductor layer. The temperature of the first heat treatment is higher than or equal to 400° C. and lower than or equal to 750° C., preferably higher than or equal to 400° C. and lower than the strain point of the substrate. For example, the oxide semiconductor layer is subjected to heat treatment in a nitrogen atmosphere at 450° C. for one hour, and then water or hydrogen is prevented from entering the oxide semiconductor layer, so that a dehydrated or dehydrogenated oxide semiconductor layer can be formed. Note that timing of the first heat treatment is not limited to this, and the first heat treatment may be performed in a later step.

Figure 7C:
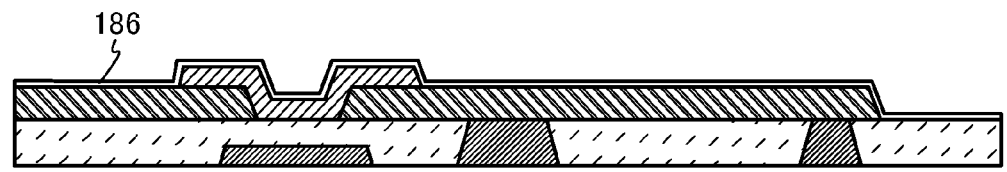

Then, an insulating layer 186 is formed to cover the semiconductor layer 184 (FIG. 7C). The insulating layer 186 functions as a gate insulating layer.

Next, second heat treatment is performed in an inert gas (including nitrogen) atmosphere or oxygen gas atmosphere (preferably at 200° C. to 400° C. inclusive, e.g. 250° C. to 350° C. inclusive). In this embodiment, the second heat treatment is performed in a nitrogen atmosphere at 300° C. for one hour. In the second heat treatment, part of the oxide semiconductor layer (a channel formation region) is heated in a state of being in contact with the insulating layer 186. In the case where oxygen is supplied to the oxide semiconductor layer, the insulating layer 186 is preferably formed using a material containing oxygen.

Note that the oxide semiconductor layer may have either an amorphous structure or a structure with crystallinity. In the case where the oxide semiconductor layer has crystallinity, the oxide semiconductor layer may be formed by two deposition steps and heat treatment may be performed twice with the two deposition.

Then, a conductive layer 188 is formed over the insulating layer 186 so as to overlap with at least a portion functioning as the channel formation region of the semiconductor layer 184.

Through the above steps, the transistor 102 can be formed.

Figure 7D:
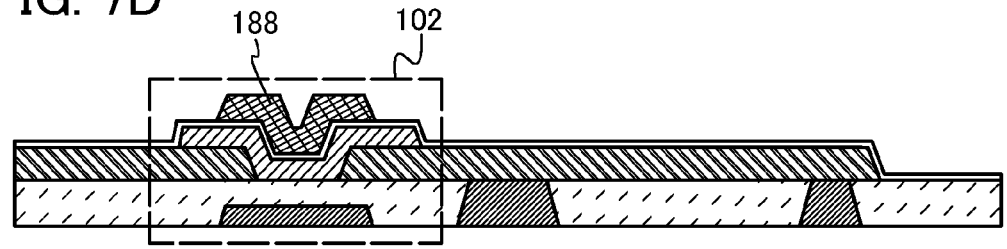

Note that the structure of the transistor 102 is not limited to that illustrated in FIG. 7D, and an electrode, a wiring, an insulating layer, and the like may be additionally formed in the transistor.

(Embodiment 2)

In this embodiment, a memory element which is an embodiment of the present invention and is different from that of Embodiment 1 will be described. Specifically, an embodiment in which a transistor in a lower portion has a structure similar to the transistor in an upper portion, which is a different point from Embodiment 1, will be described with reference to FIGS. 8A to 8C.

Figure 8A:
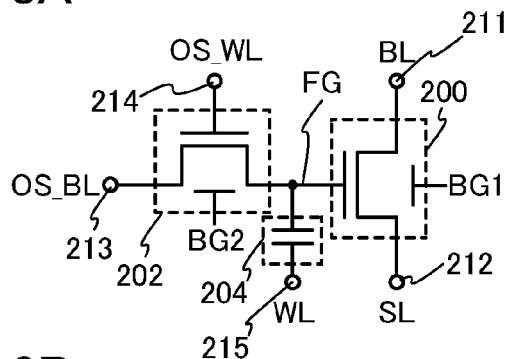
FIGS. 8A to 8C illustrate a memory element according to Embodiment 2.

A memory element illustrated in FIG. 8A includes a transistor 200, a transistor 202, and a capacitor 204. In FIG. 8A, one of source and drain electrodes of the transistor 200 is electrically connected to a first wiring 211, and the other of the source and drain electrodes of the transistor 200 is electrically connected to the second wiring 212. One of source and drain electrodes of the transistor 202 is electrically connected to a third wiring 213, and a gate electrode of the transistor 202 is electrically connected to a fourth wiring 214. A gate electrode of the transistor 200 and the other of the source and drain electrodes of the transistor 202 are electrically connected to one of electrodes of the capacitor 204. The other electrode of the capacitor 204 is electrically connected to a fifth wiring 215. The transistor 200 is provided with a back gate BG1 functioning as another gate electrode. The transistor 202 is provided with a back gate BG2 functioning as another gate electrode.

Figure 8B:
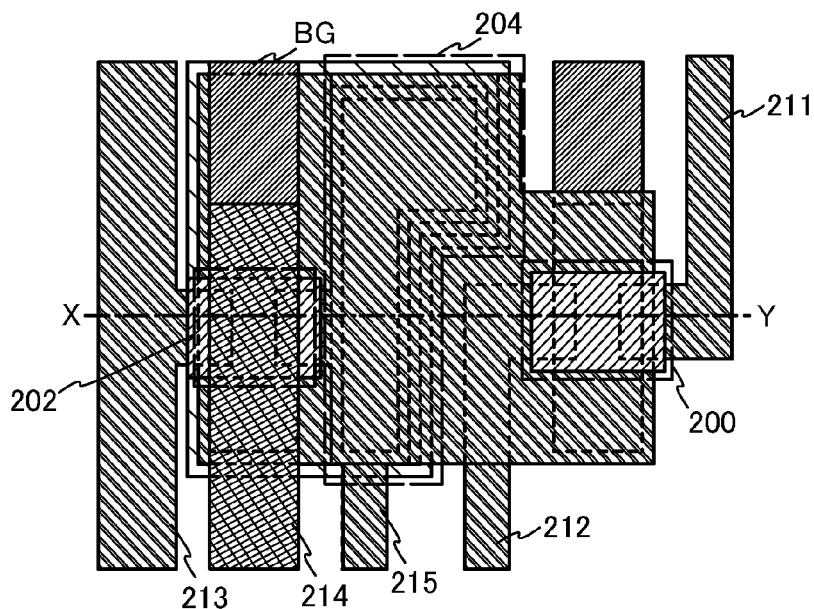
Figure 8C:
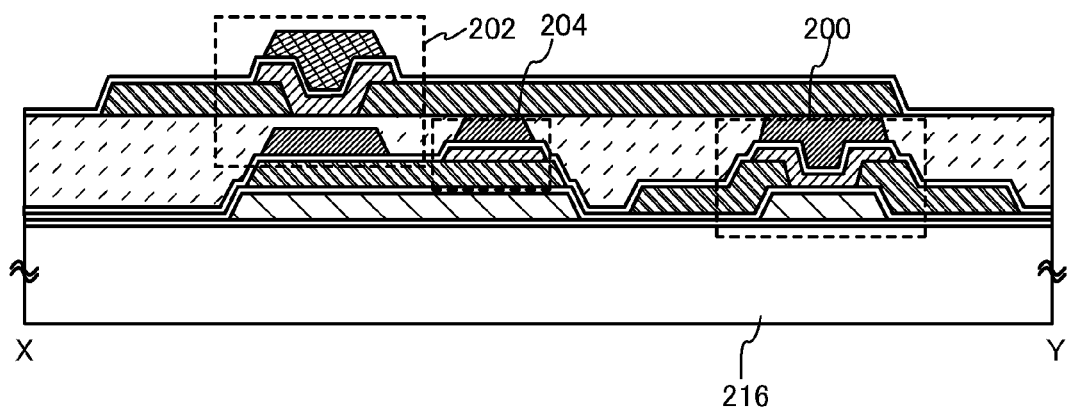

FIG. 8B is a top view illustrating an example of a specific structure of the memory element of FIG. 8A. FIG. 8C is a cross-sectional view taken along line X-Y of FIG. 8B.

As illustrated in FIG. 8B, the transistor 202 can be the same transistor as the transistor 102 of FIGS. 1A to 1C.

However, the transistor 200 is different from the transistor 100 and is a transistor which is formed similarly to the transistor 202. In other words, it is preferable for the transistor 200 to include an oxide semiconductor layer which is used for a channel formation region.

The capacitor 204 includes part of the same layer as the source and drain electrode layers of the transistor 200 and part of the same layer as the gate electrode of the transistor 200.

Further, the capacitor 204 may be constituted by including part of the same layer as the gate electrode provided on the substrate side (a layer to be the back gate of the transistor 200).

In FIG. 8C, the transistor 200 and the capacitor 204 are provided over a substrate 216. The transistor 200 and the capacitor 204 are covered with an insulating layer, and the insulating layer is subjected to planarization treatment using CMP or the like, so that the gate electrode of the transistor 200 and the one of the electrodes of the capacitor 204 are exposed. The other of the source and drain electrodes of the transistor 202 is provided on the exposed gate electrode of the transistor 200 and the one of the electrodes of the capacitor 204.

As illustrated in FIG. 8C, part of the same layer as the gate electrode of the transistor 200 (part functioning as the back gate of the transistor 202) overlaps with at least a region functioning as a channel formation region in a semiconductor layer of the transistor 202. The part functioning as the back gate of the transistor 202 and the semiconductor layer of the transistor 202 are provided so that an insulating layer over the transistor 200 is sandwiched therebetween. This insulating layer is a portion of the insulation layer which has been provided over the transistor 200 and left after the planarization treatment, due to a lack of the thickness of the semiconductor layer of the transistor 200. As described above, the transistor in an upper portion and the back gate are provided with the insulating layer which is left after the planarization treatment and interposed therebetween, and the back gate is formed of part of the same layer as the gate electrode of the transistor in a lower portion, which are one of features of the memory element that is one embodiment of the present invention. In such a manner, the back gate of the transistor in an upper portion is formed of part of the same layer as the gate electrode of the transistor in a lower portion, whereby the back gate of the transistor in an upper portion can be provided without an increase in the number of manufacturing steps.

Although FIG. 8C illustrates a structure in which both the transistor 200 and the transistor 202 are provided with the back gates, the structure of the memory element is not limited thereto. A structure where the transistor 200 is not provided with a back gate may be employed.

(Embodiment 3)

In this embodiment, an element which is an embodiment of the present invention and different from those of Embodiment 1 and Embodiment 2 will be described. Specifically, an inversion element which can be manufactured in a manner similar to that of Embodiment 1 will be described with reference to FIGS. 9A to 9C.

Figure 9A:
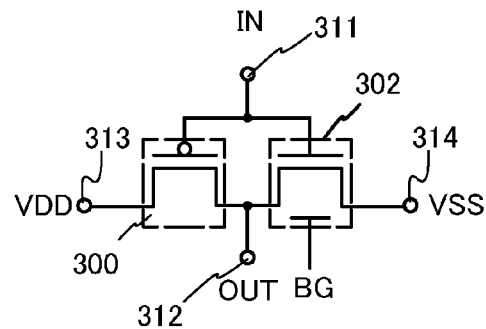
FIGS. 9A to 9C illustrate an inversion element according to Embodiment 3.

An inversion element illustrated in FIG. 9A included a transistor 300 and a transistor 302. In FIG. 9A, one of source and drain electrodes of the transistor 302 is electrically connected to a fourth wiring 314 at ground potential $V_{ss}$, and the other of the source and drain electrodes of the transistor 302 is electrically connected to one of source and drain electrodes of the transistor 300 and a second wiring 312. The other of the source and drain electrodes of the transistor 300 is electrically connected to a third wiring 313 at power supply potential $V_{dd}$. A gate electrode of the transistor 302 is connected to a gate electrode of the transistor 300 and a first wiring 311. The transistor 302 is provided with a back gate BG functioning as another gate electrode.

Figure 9B:
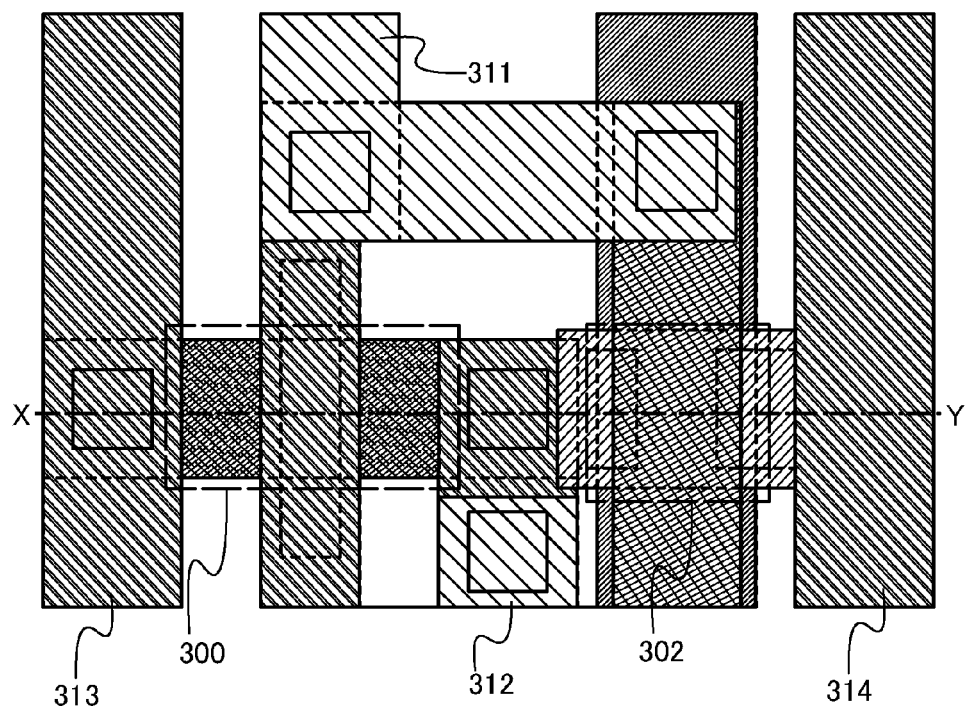
Figure 9C:
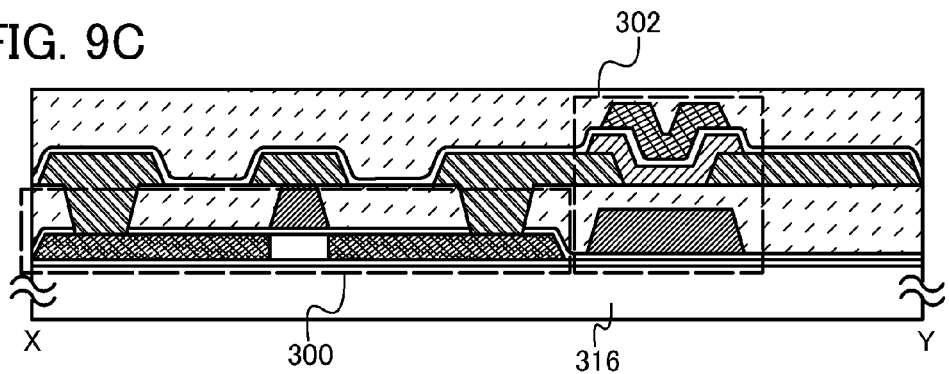

FIG. 9B is a top view illustrating an example of a specific structure of the inversion element of FIG. 9A. FIG. 9C is a cross-sectional view taken along X-Y of FIG. 9B.

As illustrated in FIG. 9B, the transistor 300 can be the same transistor as the transistor 100 of FIGS. 1A to 1C. The transistor 302 can be the same transistor as the transistor 102 of FIGS. 1A to 1C.

In FIG. 9C, the transistor 300 is provided over a substrate 316. The transistor 300 is covered with an insulating layer, and the insulating layer is subjected to planarization treatment using CMP or the like, so that the gate electrode of the transistor 300 is exposed. Over the exposed gate electrode of the transistor 300, part of the same layer as the source and drain electrode layers of the transistor 302 is provided and is electrically connected to the gate electrode of the transistor 302 through the wiring 311 (not illustrated in FIG. 9C). The transistor 300 is a p-channel transistor here but is not limited thereto.

As illustrated in FIG. 9C, part of the same layer as the gate electrode of the transistor 300 (part functioning as the back gate of the transistor 302) overlaps with at least a portion functioning as a channel formation region in a semiconductor layer of the transistor 302. The part functioning as the back gate of the transistor 302 and the semiconductor layer of the transistor 302 are provided so that an insulating layer provided over the transistor 300 is sandwiched therebetween. This insulating layer is a portion of the insulating layer which has been provided over the transistor 300 and left after the planarization treatment, due to a lack of the thickness of the semiconductor layer of the transistor 300. As described above, the transistor in an upper portion and the back gate are provided with the insulating layer which is left after the planarization treatment and interposed therebetween, and the back gate is formed of part of the same layer as the gate electrode of the transistor in a lower portion, which are one of features of the inversion element that is one embodiment of the present invention. In such a manner, the back gate of the transistor in an upper portion is formed of part of the same layer as the gate electrode of the transistor in a lower portion, whereby the back gate of the transistor in an upper portion can be provided without an increase in the number of manufacturing steps.

(Embodiment 4)

In this embodiment, an element which is an embodiment of the present invention and different those of from Embodiment 1 to Embodiment 3 will be described. Specifically, an inversion element which can be manufactured in a manner similar to that of Embodiment 2 will be described with reference to FIGS. 10A to 10C.

Figure 10A:
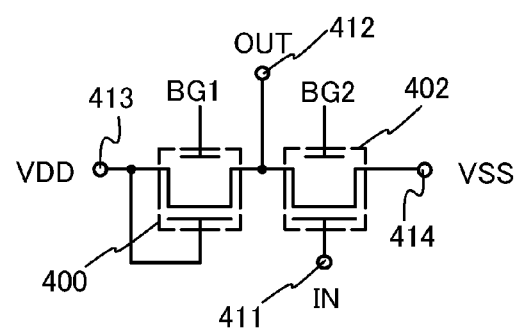
FIGS. 10A to 10C illustrate an inversion element according to Embodiment 4.

An inversion element illustrated in FIG. 10A includes a transistor 400 and a transistor 402. In FIG. 10A, one of source and drain electrodes of the transistor 402 is electrically connected to a fourth wiring 414 at ground potential $V_{ss}$, and the other of the source and drain electrodes of the transistor 402 is electrically connected to one of source and drain electrodes of the transistor 400 and a second wiring 412. The other of the source and drain electrodes of the transistor 400 is electrically connected to a third wiring 413 at power supply potential $V_{dd}$. A gate electrode of the transistor 400 is connected to the other of the source and drain electrodes of the transistor 400. A gate electrode of the transistor 402 is electrically connected to the first wiring 411. The transistor 400 is provided with a back gate BG1 functioning as another gate electrode. The transistor 402 is provided with a back gate BG2 functioning as another gate electrode.

Figure 10B:
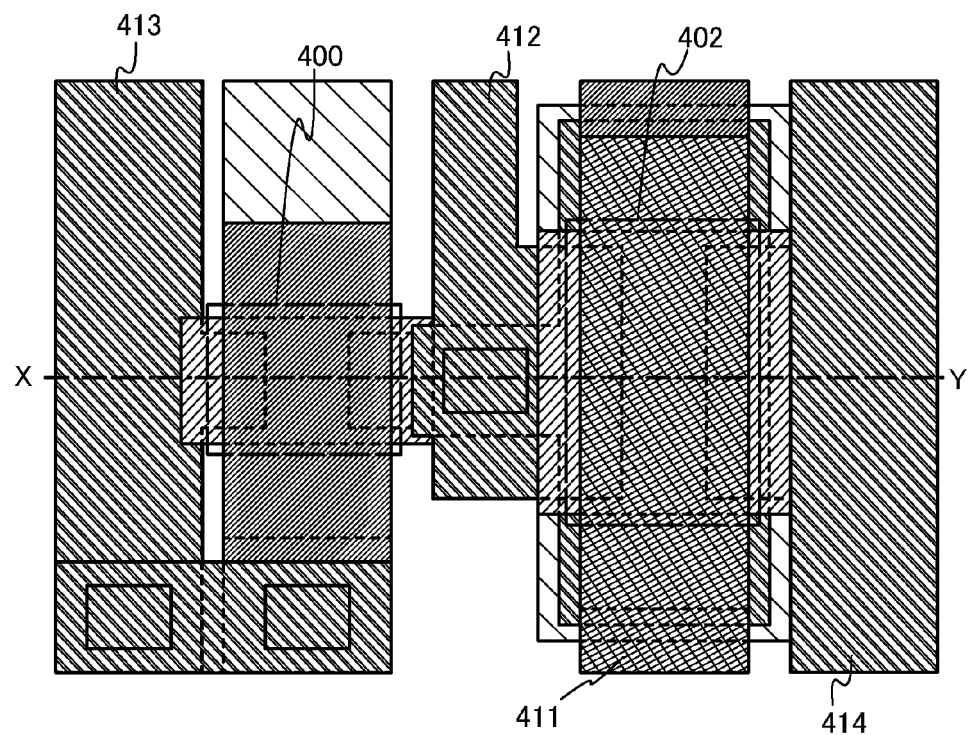
Figure 10C:
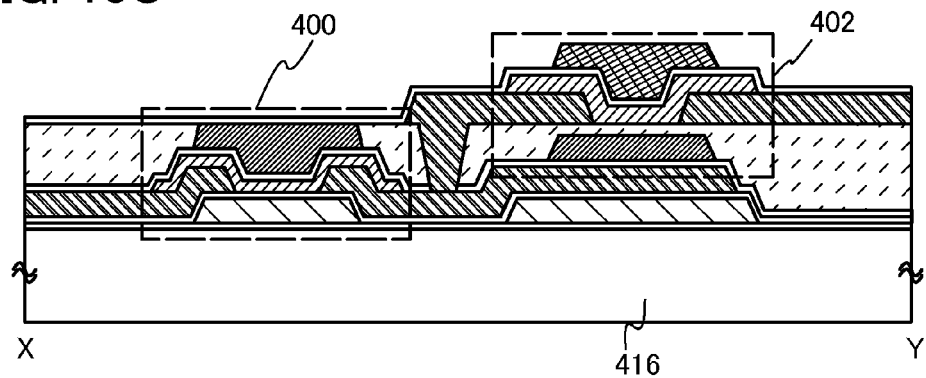

FIG. 10B is a top view illustrating an example of a specific structure of the inversion element of FIG. 10A. FIG. 10C is a cross-sectional view taken along X-Y of FIG. 10B.

As illustrated in FIG. 10B, the transistor 402 can be the same transistor as the transistor 302 of FIGS. 9A to 9C.

However, the transistor 400 is different from the transistor 300 and is a transistor which is formed similarly to the transistor 402. In other words, it is preferable for the transistor 402 to include an oxide semiconductor layer which is used for a channel formation region. Further, the channel width of the transistor 402 is preferably much larger than that of the transistor 400, further preferably three times or more that of the transistor 400, still further preferably five times or more that of the transistor 400.

In FIG. 10C, the transistor 400 is provided over the substrate 416. The transistor 400 is covered with an insulating layer, and the insulating layer is subjected to planarization treatment using CMP or the like, so that the gate electrode of the transistor 400 is exposed. Above the exposed gate electrode of the transistor 400, part of the same layer as the source and drain electrode layers of the transistor 402 is provided and electrically connects the gate electrode of the transistor 400 and the third wiring 413 (not illustrated in FIG. 10C).

As illustrated in FIG. 10C, part of the same layer as the gate electrode of the transistor 400 (part functioning as the back gate of the transistor 402) overlaps with at least a portion functioning as a channel formation region in a semiconductor layer of the transistor 402. The part functioning as the back gate of the transistor 402 and the semiconductor layer of the transistor 402 are provided so that an insulating layer provided over the transistor 400 is sandwiched therebetween. This insulating layer is a portion of the insulating layer which has been provided over the transistor 400 and left after the planarization treatment, due to a lack of thickness of the semiconductor layer of the transistor 400. As described above, the transistor in an upper portion and the back gate are provided with the insulating layer which is left after the planarization treatment and interposed therebetween, and the back gate is formed of part of the same layer as the gate electrode of the transistor in a lower portion, which are one of features of the inversion element that is one embodiment of the present invention. In such a manner, the back gate of the transistor in an upper portion is formed of part of the same layer as the gate electrode of the transistor in a lower portion, whereby the back gate of the transistor in an upper portion can be provided without an increase in the number of manufacturing steps.

(Embodiment 5)

In this embodiment, an element which is an embodiment of the present invention and different from those of Embodiment 1 to Embodiment 4 will be described. Specifically, a NAND gate which is one of logic gates and can be manufactured in a manner similar to that of Embodiment 1 will be described with reference to FIGS. 11A to 11C.

Figure 11A:
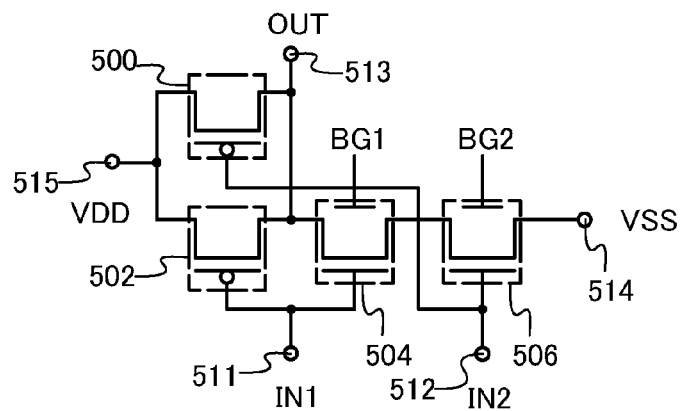
FIGS. 11A to 11C illustrate a memory element according to Embodiment 5.

A memory element illustrated in FIG. 11A includes a transistor 500, a transistor 502, a transistor 504, and a transistor 506. In FIG. 11A, one of source and drain electrodes of the transistor 500 is electrically connected to a fifth wiring 515 at power supply potential $V_{dd}$ and one of source and drain electrodes of the transistor 502. The other of the source and drain electrodes of the transistor 500 is electrically connected to a third wiring 513, the other of the source and drain electrodes of the transistor 502, and one of source and drain electrodes of the transistor 504. The other of the source and drain electrodes of the transistor 504 is electrically connected to one of source and drain electrodes of the transistor 506. The other of the source and drain electrodes of the transistor 506 is electrically connected to a fourth wiring 514 at ground potential $V_{ss}$. A gate electrode of the transistor 502 and a gate electrode of the transistor 504 are connected to a first wiring 511. A gate electrode of the transistor 500 and a gate electrode of the transistor 506 are connected to a second wiring 512. The transistor 504 is provided with a back gate BG1 functioning as another gate electrode, and the transistor 506 is provided with a back gate BG2 functioning as another gate electrode.

Figure 11B:
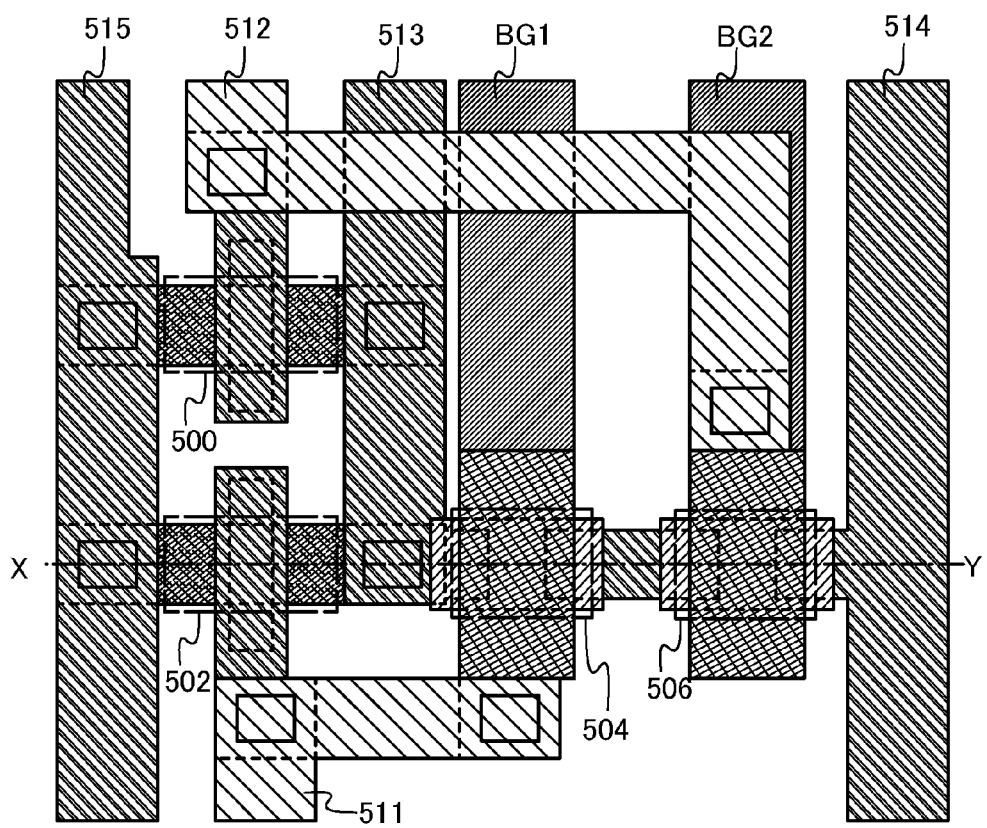
Figure 11C:
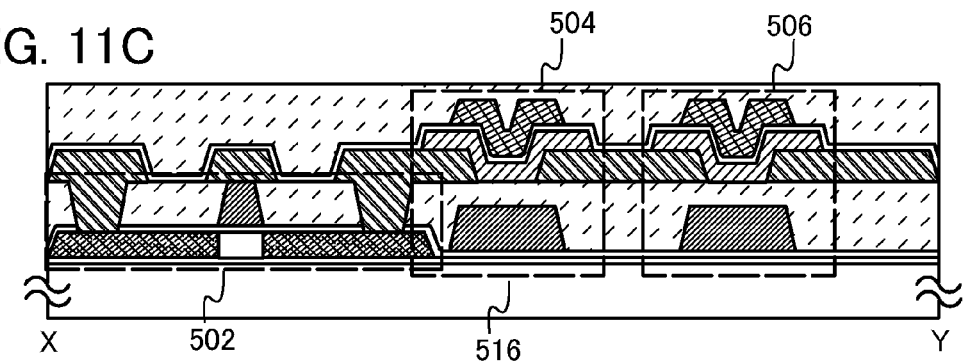

FIG. 11B is a top view illustrating an example of a specific structure of the memory element of FIG. 11A. FIG. 11C is a cross-sectional view taken along X-Y of FIG. 11B.

As illustrated in FIG. 11B, each of the transistor 500 and the transistor 502 can be the same transistor as the transistor 100 illustrated in FIGS. 1A to 1C. Each of the transistor 504 and the transistor 506 can be the same transistor as the transistor 102 illustrated in FIGS. 1A to 1C.

In FIG. 11C, the transistor 502 is formed over a substrate 516. The transistor 502 is covered with an insulating layer, and the insulating layer is planarized by CMP treatment or the like, so that the gate electrode of the transistor 502 is exposed. Over the exposed gate electrode of the transistor 502, part of the same layer as the source and drain electrode layers of the transistor 504 and the transistor 506 is provided, whereby the gate electrode of the transistor 502 and the first wiring 511 are electrically connected to each other with the same layer (not illustrated in FIG. 11C). Although not illustrated, the transistor 500 is electrically connected to the second wiring 512 in a similar manner. Note that the transistor 500 and the transistor 502 are p-channel transistors here but not limited thereto.

Parts of the same layer as the gate electrodes of the transistor 500 and the transistor 502 (parts functioning as the back gates of the transistor 504 and the transistor 506) overlap with at least portions functioning as channel formation regions in semiconductor layers of the transistor 504 and the transistor 506. The parts functioning as the back gates of the transistor 504 and the transistor 506 and the semiconductor layers of the transistor 504 and the transistor 506 are provided so that an insulating layer provided over the transistor 500 and the transistor 502 is sandwiched therebetween. This insulating layer is a portion of the insulating layer which has been provided over the transistor 500 and the transistor 502 and left after the planarization treatment, due to the thickness of the semiconductor layers of the transistor 500 and the transistor 502. As described above, the transistors in an upper portion and the back gates are provided with the insulating layer which is left after the planarization treatment and interposed therebetween, and the back gates are formed of parts of the same layer as the gate electrodes of the transistors in a lower portion, which are one of features of the memory element that is one embodiment of the present invention. In such a manner, the back gates of the transistors in an upper portion are formed of parts of the same layer as the gate electrodes of the transistors in a lower portion, whereby the back gates of the transistors in an upper portion can be provided without an increase in the number of manufacturing steps.

(Embodiment 6)

In this embodiment, an element which is an embodiment of the present invention and different from those of Embodiment 1 to Embodiment 5 will be described. Specifically, a NAND gate which is one of logic gates and can be manufactured in a manner similar to that of Embodiment 2 will be described with reference to FIGS. 12A to 12C.

Figure 12A:
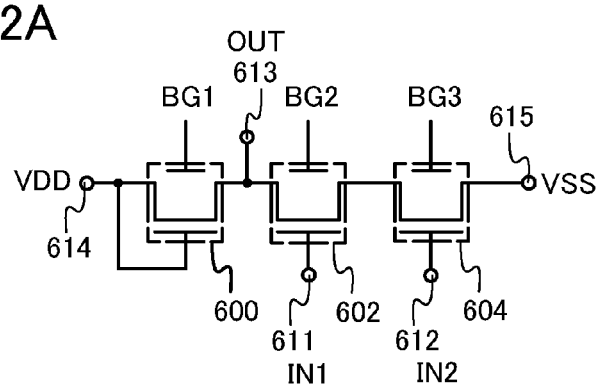
FIGS. 12A to 12C illustrate a memory element according to Embodiment 6.

A memory element illustrated in FIG. 12A includes a transistor 600, a transistor 602, and a transistor 604. In FIG. 12A, one of source and drain electrodes of the transistor 600 is connected to a fourth wiring 614 at power supply potential $V_{dd}$, and the other of the source and drain electrodes of the transistor 600 is connected to one of source and drain electrodes of the transistor 602 and a third wiring 613. The other of the source and drain electrodes of the transistor 602 is connected to one of source and drain electrodes of the transistor 604, and the other of the source and drain electrodes of the transistor 604 is connected to a fifth wiring 615 at ground potential $V_{ss}$. A gate electrode of the transistor 600 is connected to the fourth wiring 614. A gate electrode of the transistor 602 is connected to a first wiring 611. A gate electrode of the transistor 604 is connected to a second wiring 612. The transistor 600 is provided with a back gate BG1 functioning as another gate electrode. The transistor 602 is provided with a back gate BG2 functioning as another gate electrode. The transistor 604 is provided with a back gate BG3 functioning as another gate electrode.

Figure 12B:
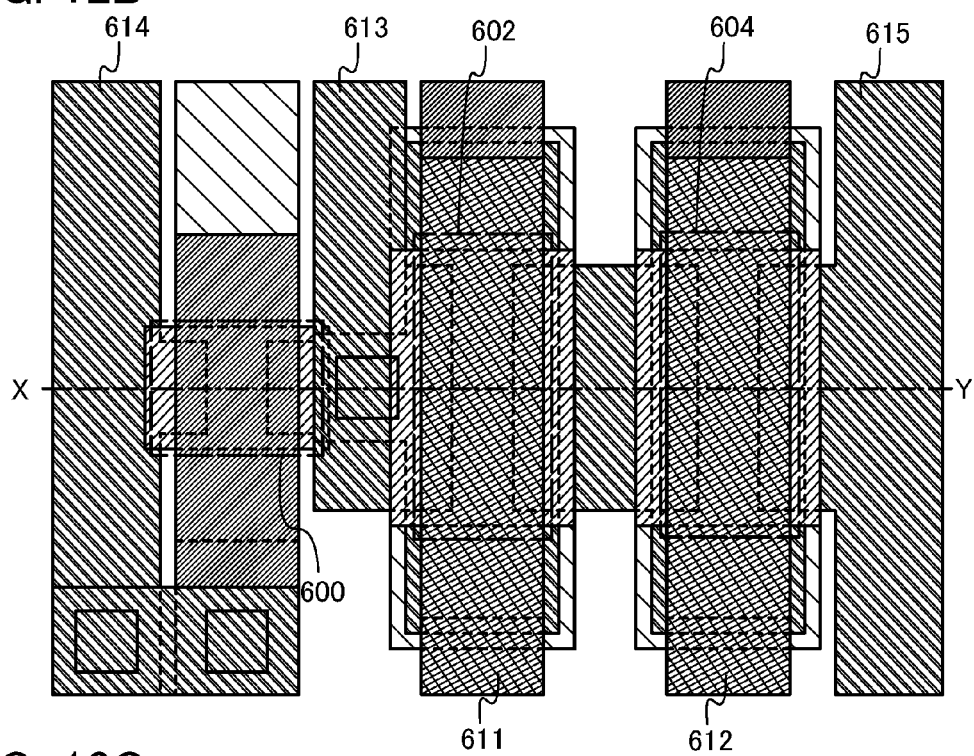
Figure 12C:
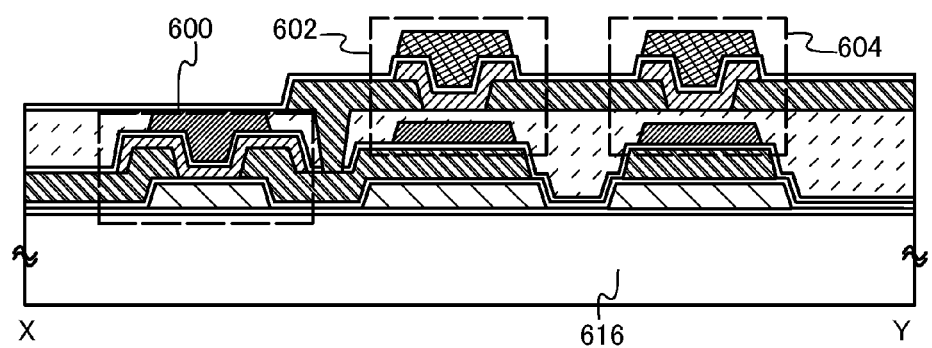

FIG. 12B is a top view illustrating an example of a specific structure of the memory element of FIG. 12A. FIG. 12C is a cross-sectional view taken along X-Y of FIG. 12B.

As illustrated in FIG. 12B, the transistor 602 and the transistor 604 can be the same transistors as the transistor 504 and the transistor 506 of FIGS. 11A to 11C.

However, the transistor 600 is different from the transistor 500 and is a transistor which is formed similarly to the transistor 602. In other words, it is preferable for the transistor 600 to include an oxide semiconductor layer which is used for a channel formation region. In addition, the channel widths of the transistor 602 and the transistor 604 are preferably much larger than that of the transistor 600, further preferably three times or more that of the transistor 600, still further preferably five times or more that of the transistor 600.

In FIG. 12C, the transistor 600 is provided over a substrate 616. The transistor 600 is covered with an insulating layer, and the insulating layer is subjected to planarization treatment using CMP or the like, so that the gate electrode of the transistor 600 is exposed. Above the exposed gate electrode of the transistor 600, part of the same layer of source and drain electrode layers of the transistor 602 and the transistor 604 are provided, whereby the gate electrode of the transistor 600 and the fourth wiring 614 are electrically connected with the same layer (not illustrated in FIG. 12C).

As illustrated in FIG. 12C, parts of the same layer as the gate electrode of the transistor 600 (parts functioning as the back gates of the transistor 602 and the transistor 604) overlap with at least portions functioning as channel formation regions in semiconductor layers of the transistor 602 and the transistor 604. The parts functioning as the back gates of the transistor 602 and the transistor 604 and the semiconductor layers of the transistor 602 and the transistor 604 are provided so that an insulating layer provided over the transistor 600 is sandwiched therebetween. This insulating layer is a portion of the insulating layer which has been provided over the transistor 600 left after the planarization treatment, due to a lack of the thickness of the semiconductor layer of the transistor 600. As described above, the transistors in an upper portion and the back gates are provided with the insulating layer which is left after the planarization treatment and interposed therebetween, and the back gates are formed of part of the same layer as the gate electrode of the transistor in a lower portion, which are one of features of the memory element that is one embodiment of the present invention. In such a manner, the back gates of the transistors in an upper portion are formed of part of the same layer as the gate electrode of the transistor in a lower portion, whereby the back gates of the transistors in an upper portion can be provided without an increase in the number of manufacturing steps.

(Embodiment 7)

In this embodiment, an element which is an embodiment of the present invention and different from those of Embodiment 1 to Embodiment 6 will be described. Specifically, a NOR gate which is one of logic gates and can be manufactured in a manner similar to that of Embodiment 1 will be described with reference to FIGS. 13A to 13C.

Figure 13A:
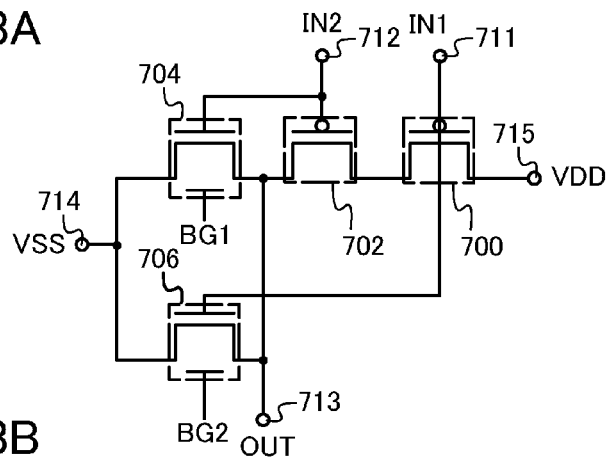
FIGS. 13A to 13C illustrate a memory element according to Embodiment 7.

A memory element illustrated in FIG. 13A includes a transistor 700, a transistor 702, a transistor 704, and a transistor 706. In FIG. 13A, one of source and drain electrodes of the transistor 700 is connected to a fifth wiring 715 at power supply potential $V_{dd}$. The other of the source and drain electrodes of the transistor 700 is connected to one of source and drain electrodes of the transistor 702. The other of the source and drain electrodes of the transistor 702 is connected to one of source and drain electrodes of the transistor 704, one of source and drain electrodes of the transistor 706, and a third wiring 713. The other of the source and drain electrodes of the transistor 704 and the other of the source and drain electrodes of the transistor 706 are connected to a fourth wiring 714 at ground potential $V_{ss}$. A gate electrode of the transistor 700 and a gate electrode of the transistor 706 are connected to a first wiring 711. A gate electrode of the transistor 702 and a gate electrode of the transistor 704 are connected to a second wiring 712. The transistor 704 is provided with a back gate BG1 functioning as another gate electrode, and the transistor 706 is provided with a back gate BG2 functioning as another gate electrode.

Figure 13B:
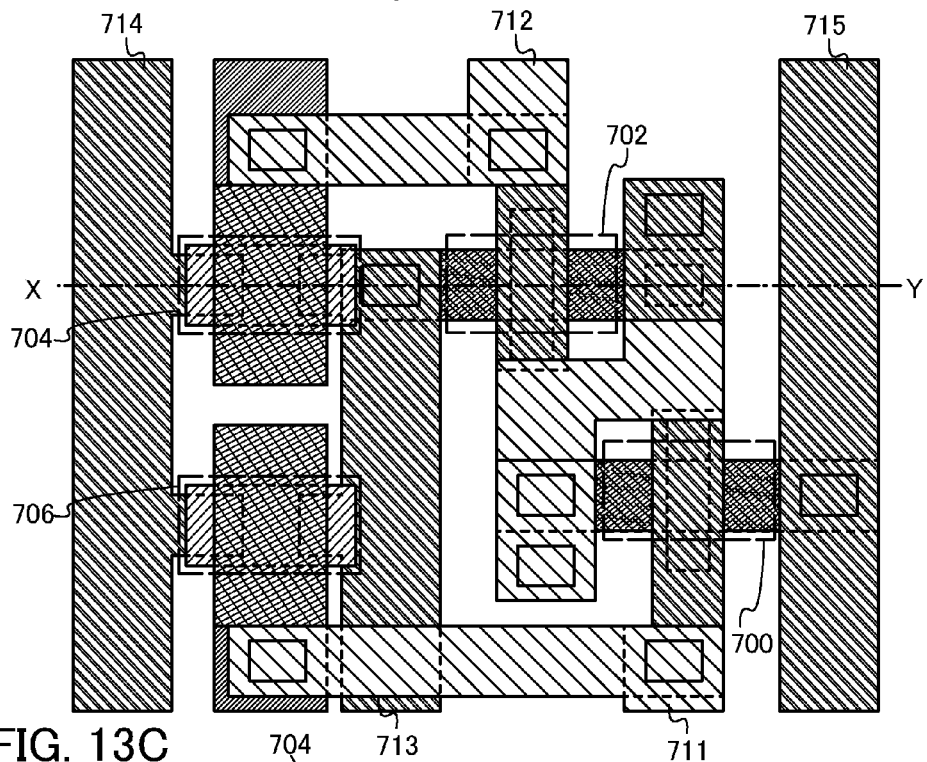
Figure 13C:
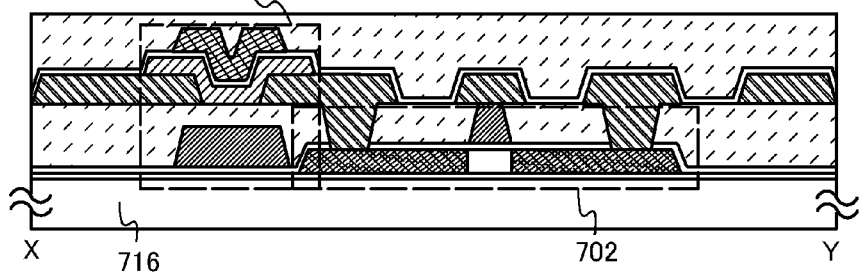

FIG. 13B is a top view illustrating a specific example of a structure of the memory element of FIG. 13A. FIG. 13C is a cross-sectional view taken along X-Y of FIG. 13B.

As illustrated in FIG. 13B, each of the transistor 700 and the transistor 702 can be the same transistor as the transistor 100 of FIGS. 1A to 1C. Each of the transistor 704 and the transistor 706 can be the same transistor as the transistor 102 of FIGS. 1A to 1C.

In FIG. 13C, the transistor 700 (not illustrated in FIG. 13C) and the transistor 702 are provided over a substrate 716. The transistor 700 and the transistor 702 are covered with an insulating layer, and the insulating layer is subjected to planarization treatment using CMP or the like, so that the gate electrodes of the transistor 700 and the transistor 702 are exposed. Over the gate electrodes of the transistor 700 and the transistor 702, part of the same layer as source and drain electrode layers of the transistor 704 and the transistor 706 are provided, whereby the gate electrode of the transistor 700 and the gate electrode of the transistor 702 are electrically connected to the first wiring 711 and the second wiring 712, respectively, with the same layers (not illustrated in FIG. 13C). Note that the transistor 700 and the transistor 702 here are p-channel transistors but not limited thereto.

As illustrated in FIG. 13C, parts of the gate electrodes of the transistor 700 (not illustrated in FIG. 13C) and the transistor 702 (parts functioning as the back gates of the transistor 704 and the transistor 706) overlap with at least channel formation regions in semiconductor layers of the transistor 704 and the transistor 706. The parts functioning as the back gates of the transistor 704 and the transistor 706 and the semiconductor layers of the transistor 704 and the transistor 706 are provided so that an insulating layer provided over the transistor 700 and the transistor 702 is sandwiched therebetween. This insulating layer is a portion of the insulating layer which has been provided over the transistor 700 and the transistor 702 left after the planarization treatment, due to the a lack of thicknesses of the semiconductor layers of the transistor 700 and the transistor 702. As described above, the transistors in an upper portion and the back gates are provided with the insulating layer which is left after the planarization treatment and interposed therebetween, and the back gates are formed of parts of the same layer as the gate electrodes of the transistors in a lower portion, which are one of features of the memory element that is one embodiment of the present invention. In such a manner, the back gates of the transistors in an upper portion are formed of parts of the same layer as the gate electrodes of the transistors in a lower portion, whereby the back gates of the transistors in an upper portion can be provided without an increase in the number of manufacturing steps.

(Embodiment 8)

In this embodiment, an element which is an embodiment of the present invention and different from those of Embodiment 1 to Embodiment 7 will be described. Specifically, a NOR gate which is one of logic gates and can be manufactured in a manner similar to that of Embodiment 2 will be described with reference to FIGS. 14A to 14C.

Figure 14A:
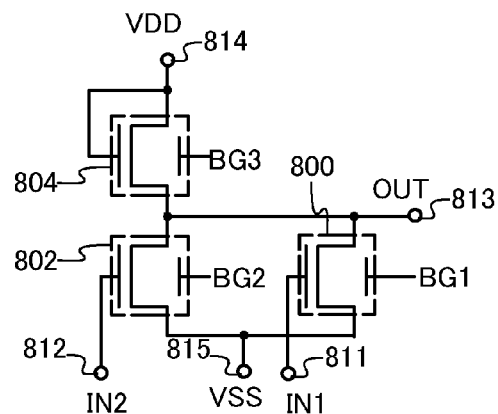
FIGS. 14A to 14C illustrate a memory element according to Embodiment 8.

A memory element illustrated in FIG. 14A includes a transistor 800, a transistor 802, and a transistor 804. In FIG. 14A, one of source and drain electrodes of the transistor 800 and one of source and drain electrodes of the transistor 802 are connected to a fifth wiring 815 at ground potential $V_{ss}$. The other of the source and drain electrodes of the transistor 800, the other of the source and drain electrodes of the transistor 802, and one of source and drain electrodes of the transistor 804 are connected to a third wiring 813. The other of the source and drain electrodes of the transistor 804 is connected to a fourth wiring 814 of power supply $V_{dd}$. A gate electrode of the transistor 800 is connected to a first wiring 811. A gate electrode of the transistor 802 is connected to a second wiring 812. A gate electrode of the transistor 804 is connected to the other of the source and drain electrodes of the transistor 804.

The transistor 800 is provided with a back gate BG1 functioning as another gate electrode. The transistor 802 is provided with a back gate BG2 functioning as another gate electrode. The transistor 804 is provided with a back gate BG3 functioning as another gate electrode.

Figure 14B:
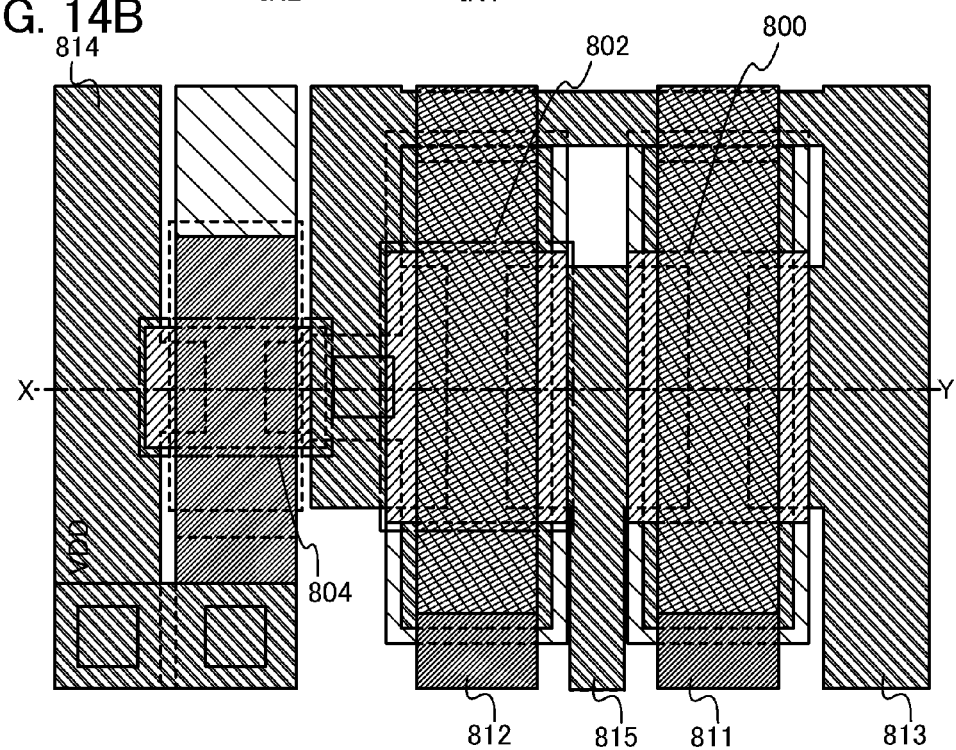
Figure 14C:
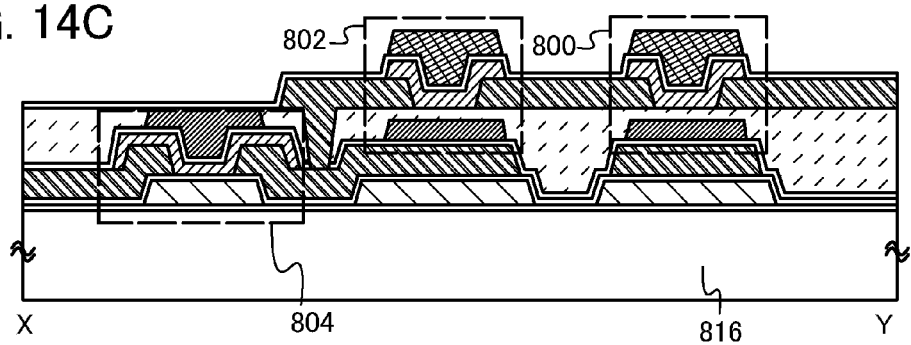

FIG. 14B is a top view illustrating a specific structure of the memory element of FIG. 14A. FIG. 14C is a cross-sectional view taken along X-Y of FIG. 14B.

As illustrated in FIG. 14B, the transistor 800 and the transistor 802 can be the same transistors as the transistor 704 and the transistor 706 of FIGS. 13A to 13C.

However, the transistor 804 is different from the transistor 700 and the transistor 702 and is a transistor which is formed similarly to the transistor 802. In other words, it is preferable for the transistor 804 to include an oxide semiconductor layer which is used for a channel formation region. In addition, the channel widths of the transistor 800 and the transistor 802 are preferably much larger than that of the transistor 804, further preferably three times or more that of the transistor 804, still further preferably five times or more that of the transistor 804.

In FIG. 14C, the transistor 804 is provided over a substrate 816. The transistor 804 is covered with an insulating layer, the insulating layer is subjected to planarization treatment using CMP or the like, so that the gate electrode of the transistor 804 is exposed. Above the exposed gate electrode of the transistor 804, part of the same layer as source and drain electrode layers of the transistor 800 and the transistor 802 is provided, whereby the gate electrode of the transistor 804 and the fourth wiring 814 are electrically connected with the same layer (not illustrated in FIG. 14C).

As illustrated in FIG. 14C, parts of the same layer as the gate electrode of the transistor 804 (parts functioning as the back gates of the transistor 800 and the transistor 802) overlap with at least portions functioning as channel formation regions in semiconductor layers of the transistor 800 and the transistor 802. The parts functioning as the back gates of the transistor 800 and the transistor 802 and the semiconductor layers of the transistor 800 and the transistor 802 are provided so that an insulating layer provided over the transistor 804 is sandwiched therebetween. This insulating layer is a portion of the insulating layer which has been provided over the transistor 804 left after the planarization treatment, due to the thickness of the semiconductor layer of the transistor 804. As described above, the transistors in an upper portion and the back gates are provided with the insulating layer which is left after the planarization treatment and interposed therebetween, and the back gates are formed of part of the same layer as the gate electrode of the transistor in a lower portion, which are one of features of the memory element that is one embodiment of the present invention. In such a manner, the back gates of the transistors in an upper portion are formed of part of the same layer as the gate electrode of the transistor in a lower portion, whereby the back gates of the transistors in an upper portion can be provided without an increase in the number of manufacturing steps.

(Embodiment 9)

In this embodiment, electronic devices which are one embodiment of the present invention will be described. In the electronic devices of this embodiment, at least one of elements described in Embodiment 1 to Embodiment 8 is mounted. Examples of the electronic devices of the present invention include computer, a mobile phone (also referred to as a cellular phone or a mobile phone device), a portable information terminal (including a portable game machine, an audio reproducing device, and the like), a digital camera, a digital video camera, electronic paper, and a television device (also referred to as a television or a television receiver).

Figure 15A:
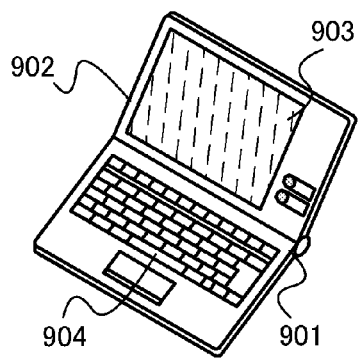
FIGS. 15A to 15F illustrate electronic devices according to Embodiment 9.

FIG. 15A illustrates a laptop personal computer including a housing 901, a housing 902, a display portion 903, a keyboard 904, and the like. The element described in any of Embodiment 1 to Embodiment 8 is provided in the housing 901 and the housing 902. The memory described in any of Embodiment 1 to Embodiment 8 is mounted on the laptop personal computer illustrated in FIG. 15A, whereby consumed power and the area occupied by the element can be reduced.

Figure 15B:
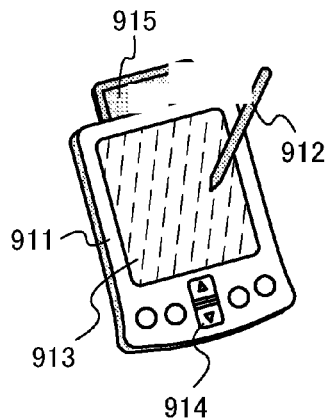

FIG. 15B illustrates a personal digital assistant (PDA) in which a main body 911 is provided with a display portion 913, an external interface 915, operation buttons 914, and the like. Further, a stylus 912 for operating the portable information terminal or the like is provided. The element described in any of Embodiment 1 to Embodiment 8 is provided in the main body 911. The memory described in any of Embodiment 1 to Embodiment 8 is mounted on the PDA illustrated in FIG. 15B, whereby consumed power and the area occupied by the element can be reduced.

Figure 15C:
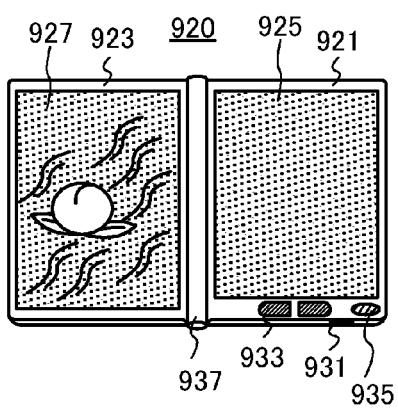

FIG. 15C illustrates an electronic book reader 920 mounting electronic paper.

The electronic book reader 920 has two housings of a housing 921 and a housing 923. The housing 921 and the housing 923 are provided with a display portion 925 and a display portion 927, respectively. The housing 921 and the housing 923 are connected by a hinge 937 and can be opened and closed with the hinge 937 as an axis. Further, the housing 921 is provided with a power switch 931, operation keys 933, a speaker 935, and the like. At least one of the housing 921 and the housing 923 is provided with the memory described in any of Embodiment 1 to Embodiment 8. The memory described in any of Embodiment 1 to Embodiment 8 is mounted on the electronic book reader illustrated in FIG. 15C, whereby consumed power and the area occupied by the element can be reduced.

Figure 15D:
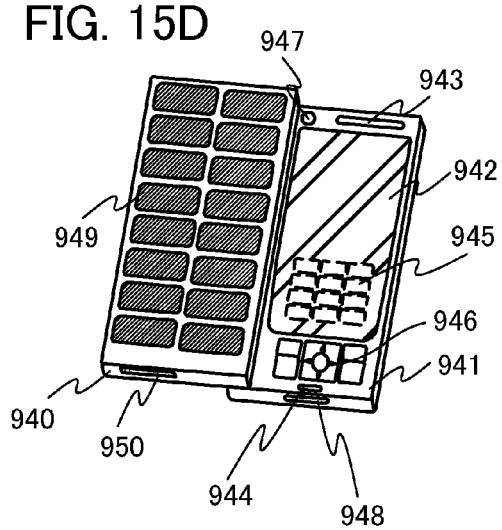

FIG. 15D illustrates a mobile phone including two housings of a housing 940 and a housing 941. Further, the housing 940 and the housing 941 in a state where they are developed as illustrated in FIG. 15D can shift by sliding so that one is lapped over the other; therefore, the size of the mobile phone can be reduced, which makes the mobile phone suitable for being carried. The housing 941 is provided with a display panel 942, a speaker 943, a microphone 944, an operation key 945, a pointing device 946, a camera lens 947, an external connection terminal 948, and the like. The housing 940 is provided with a solar cell 949 that charges the mobile phone, an external memory slot 950, and the like. Note that an antenna is incorporated in the housing 941. At least one of the housing 940 and the housing 941 is provided with the element described in any of Embodiment 1 to Embodiment 8. The memory described in any of Embodiment 1 to Embodiment 8 is mounted on the mobile phone illustrated in FIG. 15D, whereby consumed power and the area occupied by the element can be reduced.

Figure 15E:
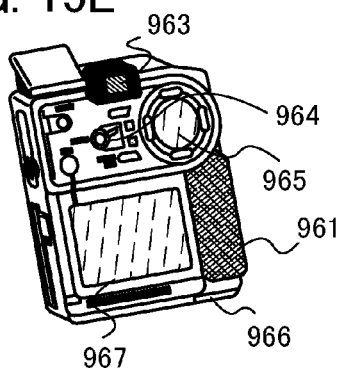

FIG. 15E illustrates a digital camera including a main body 961, a display portion 967, an eyepiece 963, an operation switch 964, a display portion 965, a battery 966, and the like. The memory described in any of Embodiment 1 to Embodiment 8 is provided in the main body 961. The memory described in any of Embodiment 1 to Embodiment 8 is mounted on the digital camera illustrated in FIG. 15E, whereby consumed power and the area occupied by the element can be reduced.

Figure 15F:
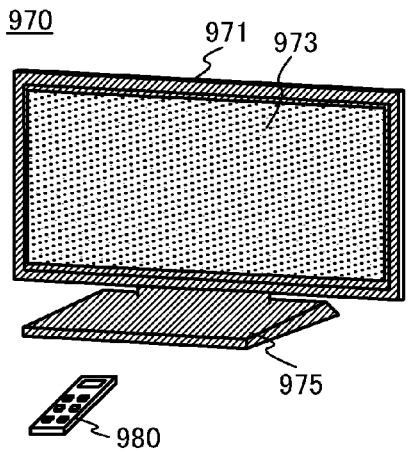

FIG. 15F is a television device 970 including a housing 971, a display portion 973, a stand 975, and the like. The television device 970 can be operated by an operation switch of the housing 971 or a separate remote controller 980. The housing 971 and the remote controller 980 are provided with the memory described in any of Embodiment 1 to Embodiment 8. The memory described in any of Embodiment 1 to Embodiment 8 is mounted on the television device illustrated in FIG. 15F, whereby consumed power and the area occupied by the element can be reduced.

This application is based on Japanese Patent Application serial no. 2010-035435 filed with Japan Patent Office on Feb. 19, 2010, the entire contents of which are hereby incorporated by reference.

EXPLANATION OF REFERENCE

100: transistor, 102: transistor, 104: capacitor, 111: first wiring, 112: second wiring, 113: third wiring, 114: fourth wiring, 115: fifth wiring, 116: substrate, 120: memory element, 121: driver circuit, 122: driver circuit, 123: driver circuit, 124: driver circuit, 150: base substrate, 152: nitrogen-containing layer, 160: bond substrate, 162: oxide film, 164: embrittled region, 166: single-crystal semiconductor layer, 168: semiconductor layer, 170: semiconductor layer, 172: insulating layer, 174: gate electrode, 176: impurity region, 178: channel formation region, 180: interlayer insulating layer, 182: conductive layer, 184: semiconductor layer, 186: insulating layer, 188: conductive layer, 200: transistor, 202: transistor, 204: capacitor, 211: first wiring, 212: second wiring, 213: third wiring, 214: fourth wiring, 215: fifth wiring, 216: substrate, 300: transistor, 302: transistor, 311: first wiring, 312: second wiring, 313: third wiring, 314: fourth wiring, 316: substrate, 400: transistor, 402: transistor, 411: first wiring, 412: second wiring, 413: third wiring, 414: fourth wiring, 416: substrate, 500: transistor, 502: transistor, 504: transistor, 506: transistor, 511: first wiring, 512: second wiring, 513: third wiring, 514: fourth wiring, 515: fifth wiring, 516: substrate, 600: transistor, 602: transistor, 604: transistor, 611: first wiring, 612: second wiring, 613: third wiring, 614: fourth wiring, 615: fifth wiring, 616: substrate, 700: transistor, 702: transistor, 704: transistor, 706: transistor, 711: first wiring, 712: second wiring, 713: third wiring, 714: fourth wiring, 715: fifth wiring, 716: substrate, 800: transistor, 802: transistor, 804: transistor, 811: first wiring, 812: second wiring, 813: third wiring, 814: fourth wiring, 815: fifth wiring, 816: substrate, 901: housing, 902: housing, 903: display portion, 904: keyboard, 911: main body, 912: stylus, 913: display portion, 914: operation button, 915: external interface, 920: electronic book reader, 921: housing, 923: housing, 925: display portion, 927: display portion, 931: power switch, 933: operation key, 935: speaker, 937: hinge, 940: housing, 941: housing, 942: display panel, 943: speaker, 944: microphone, 945: operation key, 946: pointing device, 947: camera lens, 948: external connection terminal, 949: solar cell, 950: external memory slot, 961: main body, 963: eyepiece, 964: operation switch, 965: display portion, 966: battery, 967: display portion, 970: television device, 971: housing, 973: display portion, 975: stand, 980: remote controller

The invention claimed is:

1. A semiconductor device comprising an element, the element comprising:
   a first transistor comprising a first semiconductor layer and a first gate electrode;
   an insulating layer over at least a part of the first transistor; and
   a second transistor comprising a back gate electrode, a second semiconductor layer over the back gate electrode and a second gate electrode over the second semiconductor layer,
   wherein the insulating layer is interposed between the second semiconductor layer and the back gate electrode,
   wherein the second semiconductor layer comprises an oxide semiconductor film, and
   wherein the back gate electrode is formed from a same film as the first gate electrode.

2. The semiconductor device according to claim 1, wherein the first transistor is supported by an SOI substrate.

3. The semiconductor device according to claim 1, wherein the first transistor is supported by a silicon substrate.

4. The semiconductor device according to claim 1, wherein the insulating layer has a leveled upper surface.

5. The semiconductor device according to claim 1, wherein a top surface of the first gate electrode is not covered by the insulating layer.

6. The semiconductor device according to claim 1, wherein a distance between the back gate electrode and a channel formation region of the second semiconductor layer is equal to a thickness of the first semiconductor layer.

7. The semiconductor device according to claim 1, wherein the element is a memory element.

8. The semiconductor device according to claim 1, wherein the element is an inversion element.

9. A semiconductor device comprising an element, the element comprising:
   a first transistor comprising a first semiconductor layer and a first gate electrode;
   an insulating layer over at least a part of the first transistor; and
   a second transistor comprising a back gate electrode, a second semiconductor layer over the back gate electrode, a second gate electrode over the second semiconductor layer and a source electrode and a drain electrode,
   wherein the insulating layer is interposed between the second semiconductor layer and the back gate electrode,
   wherein the second semiconductor layer comprises an oxide semiconductor film,
   wherein the back gate electrode is formed from a same film as the first gate electrode, and
   wherein the first gate electrode is in contact with one of the source electrode and the drain electrode.

10. The semiconductor device according to claim 9, wherein the first transistor is supported by an SOI substrate.

11. The semiconductor device according to claim 9, wherein the first transistor is supported by a silicon substrate.

12. The semiconductor device according to claim 9, wherein the insulating layer has a leveled upper surface.

13. The semiconductor device according to claim 9, wherein a top surface of the first gate electrode is not covered by the insulating layer.

14. The semiconductor device according to claim 9, wherein a distance between the back gate electrode and a channel formation region of the second semiconductor layer is equal to a thickness of the first semiconductor layer.

15. The semiconductor device according to claim 9, wherein the element is a memory element.

16. The semiconductor device according to claim 9,
wherein the element is an inversion element.

17. A semiconductor device comprising an element, the element comprising:
- a first transistor comprising a first semiconductor layer and a first gate electrode;
- an insulating layer over at least a part of the first transistor;
- a second transistor comprising a back gate electrode, a second semiconductor layer over the back gate electrode and a second gate electrode over the second semiconductor layer; and
- a capacitor comprising a first capacitor electrode and a second capacitor electrode over the first capacitor electrode,
- wherein the insulating layer is interposed between the second semiconductor layer and the back gate electrode,
- wherein the second semiconductor layer comprises an oxide semiconductor film, and
- wherein the back gate electrode, the first gate electrode and the second capacitor electrode are formed from a same film as the first gate electrode.

18. The semiconductor device according to claim 17,
wherein the first transistor is supported by an SOI substrate.

19. The semiconductor device according to claim 17,
wherein the first transistor is supported by a silicon substrate.

20. The semiconductor device according to claim 17,
wherein the insulating layer has a leveled upper surface.

21. The semiconductor device according to claim 17,
wherein a top surface of the first gate electrode is not covered by the insulating layer.

22. The semiconductor device according to claim 17,
wherein a distance between the back gate electrode and a channel formation region of the second semiconductor layer is equal to a thickness of the first semiconductor layer.

23. The semiconductor device according to claim 17,
wherein the element is a memory element.

24. The semiconductor device according to claim 17,
wherein the element is an inversion element.

* * * * *